(12) United States Patent
Feng et al.

(10) Patent No.: US 12,100,649 B2
(45) Date of Patent: Sep. 24, 2024

(54) PACKAGE COMPRISING AN INTEGRATED DEVICE WITH A BACK SIDE METAL LAYER

(71) Applicant: QUALCOMM Incorporated, San Diego, CA (US)

(72) Inventors: Chien-Te Feng, Frisco, TX (US); Wen Yin, San Diego, CA (US); Jay Scott Salmon, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 17/482,294

(22) Filed: Sep. 22, 2021

(65) Prior Publication Data
US 2023/0091182 A1    Mar. 23, 2023

(51) Int. Cl.
| H01L 23/552 | (2006.01) |
| H01L 21/56 | (2006.01) |
| H01L 23/00 | (2006.01) |
| H01L 23/31 | (2006.01) |
| H01L 23/36 | (2006.01) |
| H01L 23/522 | (2006.01) |
| H01L 23/60 | (2006.01) |

(52) U.S. Cl.
CPC .......... *H01L 23/5226* (2013.01); *H01L 21/56* (2013.01); *H01L 23/31* (2013.01); *H01L 23/36* (2013.01); *H01L 23/60* (2013.01); *H01L 24/20* (2013.01)

(58) Field of Classification Search
CPC .............. H01L 23/552; H01L 23/5226; H01L 21/56; H01L 23/31; H01L 23/36; H01L 23/60; H01L 24/20

USPC ......................................................... 257/659
See application file for complete search history.

(56) References Cited

U.S. PATENT DOCUMENTS

| 2013/0062746 | A1* | 3/2013 | Schwarz | H01L 24/11 257/676 |
| 2015/0179621 | A1* | 6/2015 | Matsumoto | H01L 24/17 257/737 |
| 2016/0225745 | A1* | 8/2016 | Beer | H01L 25/0657 |
| 2019/0067207 | A1* | 2/2019 | Hu | H01L 21/4871 |
| 2019/0287947 | A1 | 9/2019 | Chen et al. | |
| 2020/0161252 | A1* | 5/2020 | Yang | H01L 21/561 |
| 2020/0176391 | A1* | 6/2020 | Lim | H01L 23/13 |
| 2021/0175178 | A1* | 6/2021 | We | H01L 21/565 |
| 2021/0280507 | A1* | 9/2021 | Aldrete | H01L 23/3128 |
| 2022/0068662 | A1* | 3/2022 | Fang | H01L 23/49811 |

OTHER PUBLICATIONS

International Search Report and Written Opinion—PCT/US2022/041235—ISA/EPO—Dec. 5, 2022.

* cited by examiner

*Primary Examiner* — Didarul A Mazumder
(74) *Attorney, Agent, or Firm* — Loza & Loza, LLP

(57) ABSTRACT

A device comprising a package and a board. The package includes a substrate comprising a first surface and a second surface, a passive component coupled to the first surface of the substrate, an integrated device coupled to the second surface of the substrate, a back side metal layer coupled to a back side of the integrated device, a first solder interconnect coupled to the back side metal layer, and a plurality of solder interconnects coupled to the second surface of the substrate. The board is coupled to the package through the plurality of solder interconnects. The first solder interconnect is coupled to the board.

34 Claims, 16 Drawing Sheets

CROSS SECTIONAL PROFILE VIEW

CROSS SECTIONAL PROFILE VIEW

CROSS SECTIONAL PROFILE VIEW

CROSS SECTIONAL PROFILE VIEW

PACKAGE COMPRISING AN INTEGRATED DEVICE WITH A BACK SIDE METAL LAYER

FIELD

Various features relate to packages with an integrated device.

BACKGROUND

A package may include a substrate and integrated devices. Integrated devices may generate a lot of heat during operation, which can affect the performance of the integrated devices and/or the package. There is an ongoing need to provide integrated devices and packages with improved heat dissipation performance.

SUMMARY

Various features relate to packages with an integrated device.

One example provides a device comprising a package and a board. The package includes a substrate comprising a first surface and a second surface, a passive component coupled to the first surface of the substrate, an integrated device coupled to the second surface of the substrate, a back side metal layer coupled to a back side of the integrated device, a first solder interconnect coupled to the back side metal layer, and a plurality of solder interconnects coupled to the second surface of the substrate. The board is coupled to the package through the plurality of solder interconnects. The first solder interconnect is coupled to the board.

Another example provides a package that includes a substrate comprising a first surface and a second surface, a passive component coupled to the first surface of the substrate, an integrated device coupled to the second surface of the substrate, a back side metal layer coupled to a back side of the integrated device, a first solder interconnect coupled to the back side metal layer, and a plurality of solder interconnects coupled to the second surface of the substrate.

Another example provides a method that provides a package. The package includes a substrate comprising a first surface and a second surface, a passive component coupled to the first surface of the substrate, an integrated device coupled to the second surface of the substrate, a back side metal layer coupled to a back side of the integrated device, a first solder interconnect coupled to the back side metal layer; and a plurality of solder interconnects coupled to the second surface of the substrate. The method couples the package to a board coupled through the plurality of solder interconnects. The first solder interconnect is coupled to the board.

BRIEF DESCRIPTION OF THE DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a device that includes a package and a board. The package includes a substrate comprising a first surface and a second surface, a passive component coupled to the first surface of the substrate, an integrated device coupled to the second surface of the substrate, a back side metal layer coupled to a back side of the integrated device, a first solder interconnect coupled to the back side metal layer, and a plurality of solder interconnects coupled to the second surface of the substrate. The board is coupled to the package through the plurality of solder interconnects. The first solder interconnect is coupled to the board. The package and the board are configured to dissipate heat from the integrated device through the back side metal layer, the first solder interconnect and the board. The back side metal layer may be configured as an electromagnetic interference (EMI) shield for the integrated device and/or the package. Thus, the back side metal layer may provide multiple functionalities for the package. The back side metal layer helps improve the performance of the integrated device and/or the package by efficiently dissipating heat away from the integrated device and by helping shield the integrated device from other signals and/or currents.

Exemplary Package Comprising an Integrated Device with Back Side Metal Layer

Figure 1:
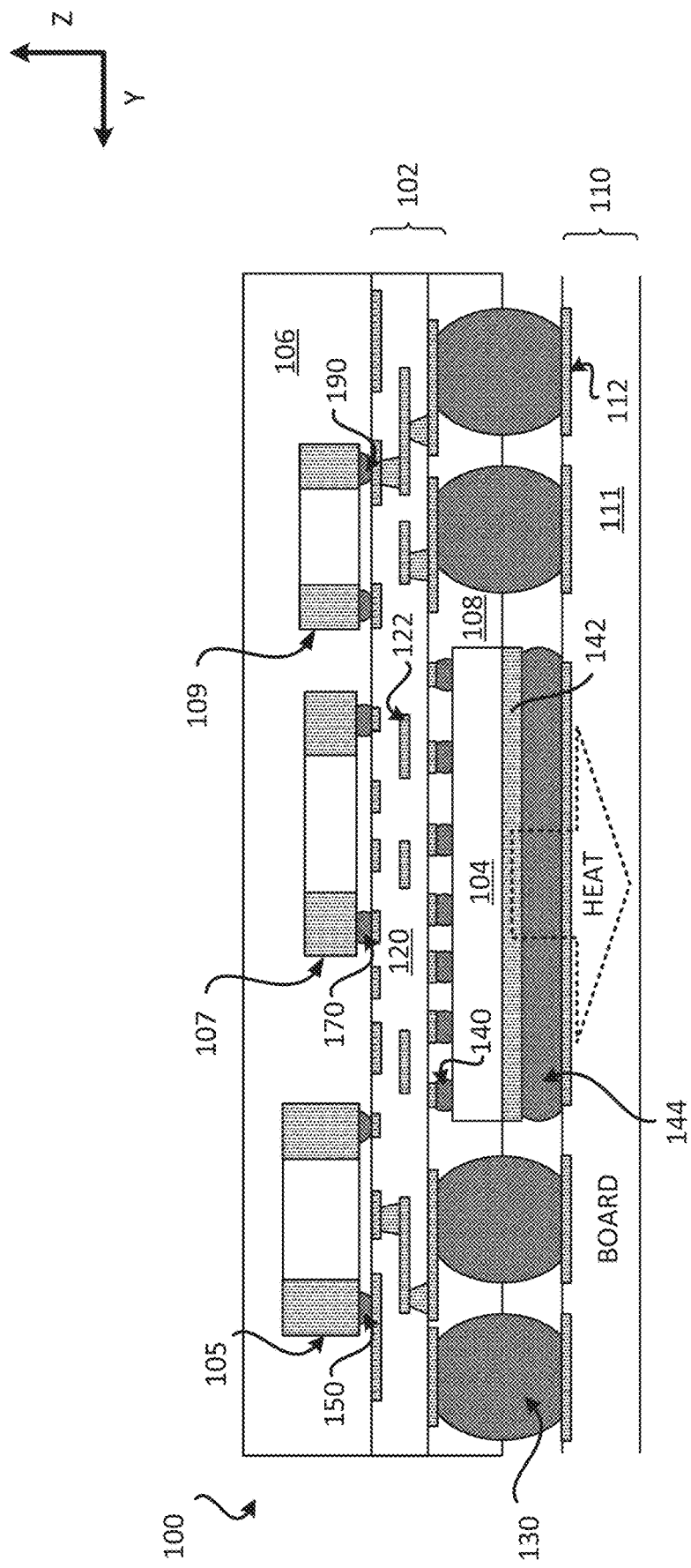
FIG. 1 illustrates an exemplary cross sectional profile view of a package that includes an integrated device with a back side metal layer.

FIG. 1 illustrates a cross sectional profile view of a package 100 that includes an integrated device with a back side metal layer. The back side metal layer may be configured to dissipate heat from the integrated device and/or configured as an electromagnetic interference (EMI) shield for the integrated device and/or the package.

The package 100 includes a substrate 102, an integrated device 104, a passive component 105, a passive component 107, a passive component 109, an encapsulation layer 106 and an encapsulation layer 108. The package 100 may also include a plurality of solder interconnects 130.

The substrate 102 includes at least one dielectric layer 120, a plurality of interconnects 122. The substrate 102 may be a coreless substrate (e.g., embedded trace substrate (ETS)). The substrate 102 may include a first surface (e.g., top surface) and a second surface (e.g., bottom surface). Different packages may use different substrates. In some implementations, the package 100 may include a cored substrate.

The passive component 105 is coupled to the first surface of the substrate 102 through a plurality of solder interconnects 150. The passive component 107 is coupled to the first surface of the substrate 102 through a plurality of solder interconnects 170. The passive component 109 is coupled to the first surface of the substrate 102 through a plurality of solder interconnects 190. A passive component (e.g., 105, 107, 109) may include a capacitor and/or an inductor.

The encapsulation layer 106 is provided (e.g., formed) over the first surface of the substrate 102. The encapsulation layer 106 may encapsulate the passive component(s) (e.g., 105, 107, 109). The encapsulation layer 106 may include a mold, a resin and/or an epoxy. A compression molding process, a transfer molding process, or a liquid molding process may be used to form the encapsulation layer 106. The encapsulation layer 106 may be photo etchable. The encapsulation layer 106 may be a first encapsulation layer. The encapsulation layer 106 may be a means for first encapsulation.

The integrated device 104 is coupled to a second surface (e.g., bottom surface) of the substrate 102 through a plurality of solder interconnects 140. For example, the integrated device 104 is coupled to the plurality of interconnects 122 of the substrate 102 through the plurality of solder interconnects 140. The integrated device 104 includes a front side and a back side. The front side of the integrated device 104 may face the substrate 102, while the back side of the integrated device 104 may face away from the substrate 102. The back side of the integrated device 104 may face a board 110. The plurality of solder interconnects 130 is coupled to the second surface of the substrate 102. The plurality of solder interconnects 130 may be coupled to the plurality of interconnects 122 of the substrate 102.

The encapsulation layer 108 is provided (e.g., formed) over the second surface (e.g., bottom surface) of the substrate 102. The encapsulation layer 108 may at least partially encapsulate the integrated device 104 and the plurality of solder interconnects 130. The encapsulation layer 108 may include a mold, a resin and/or an epoxy. A compression molding process, a transfer molding process, or a liquid molding process may be used to form the encapsulation layer 108. The encapsulation layer 108 may be photo etchable. The encapsulation layer 108 may be a second encapsulation layer. The encapsulation layer 108 may be a means for second encapsulation.

The back side metal layer 142 is coupled to the back side of the integrated device 104. As will be further described below in at least FIG. 2, the back side metal layer 142 may be located over and coupled to a die substrate of the integrated device 104. In some implementations, the back side metal layer 142 may be considered part of the integrated device 104. In some implementations, the back side metal layer 142 may be considered part of the back side of the integrated device 104. Different implementations may use different materials for the back side metal layer 142. For example, the back side metal layer 142 may include stainless steel (SUS), copper (Cu), palladium (Pd), and/or gold (Au). A first solder interconnect 144 is coupled to the back side metal layer 142.

The package 100 may be coupled to a board 110 through the plurality of solder interconnects 130 and the first solder interconnect 144. The board 110 may include a printed circuit board (PCB). The board 110 includes at least one dielectric layer 111 and a plurality of board interconnects 112. The package 100 may be coupled to the plurality of board interconnects 112 through the plurality of solder interconnects 130 and the first solder interconnect 144. The package 100 and the board 110 may be part of an assembly and/or a device.

The package 100 is coupled to the board 110 such that the back side of the integrated device 104 faces the board 110. The back side of the integrated device 104 and the back side metal layer 142 may be coupled to the board 110 through the first solder interconnect 144. The back side metal layer 142 may be free of an electrical connection with an active device (e.g., transistor) of the integrated device 104. The back side metal layer 142 and the first solder interconnect 144 may be configured to be coupled to ground. The back side metal layer 142 may be configured as an electromagnetic interference (EMI) shield for the integrated device 104 and/or the package 100. The back side metal layer 142 may be configured as a bottom side EMI shield for the package 100.

The package 100 and the board 110 are coupled to each other such that the package 100 and the board 110 may be configured to dissipate heat from the integrated device 104 through the back side metal layer 142, the first solder interconnect 144 and the board 110. For example, the package 100 and the board 110 are coupled to each other such that the package 100 and the board 110 may be configured to dissipate heat from the integrated device 104 through the back side metal layer 142, the first solder interconnect 144 and at least one board interconnect from the plurality of board interconnects 112. Heat that dissipates through the back side metal layer 142, the first solder interconnect 144 and at least one board interconnect from the plurality of board interconnects 112 dissipate through heat conduction, which is much more efficient and effective than heat that is dissipated through convection. Since the board 110 and the plurality of board interconnects 112 are relatively large components, they can be effective heat dissipators for heat that may be generated and/or located at or near the integrated device 104.

The ability of the back side metal layer 142 to be configured as both an EMI shield and as a heat dissipator, enables the back side metal layer 142 to help improve the performance of the integrated device 104 and/or the package 100.

Figure 2:
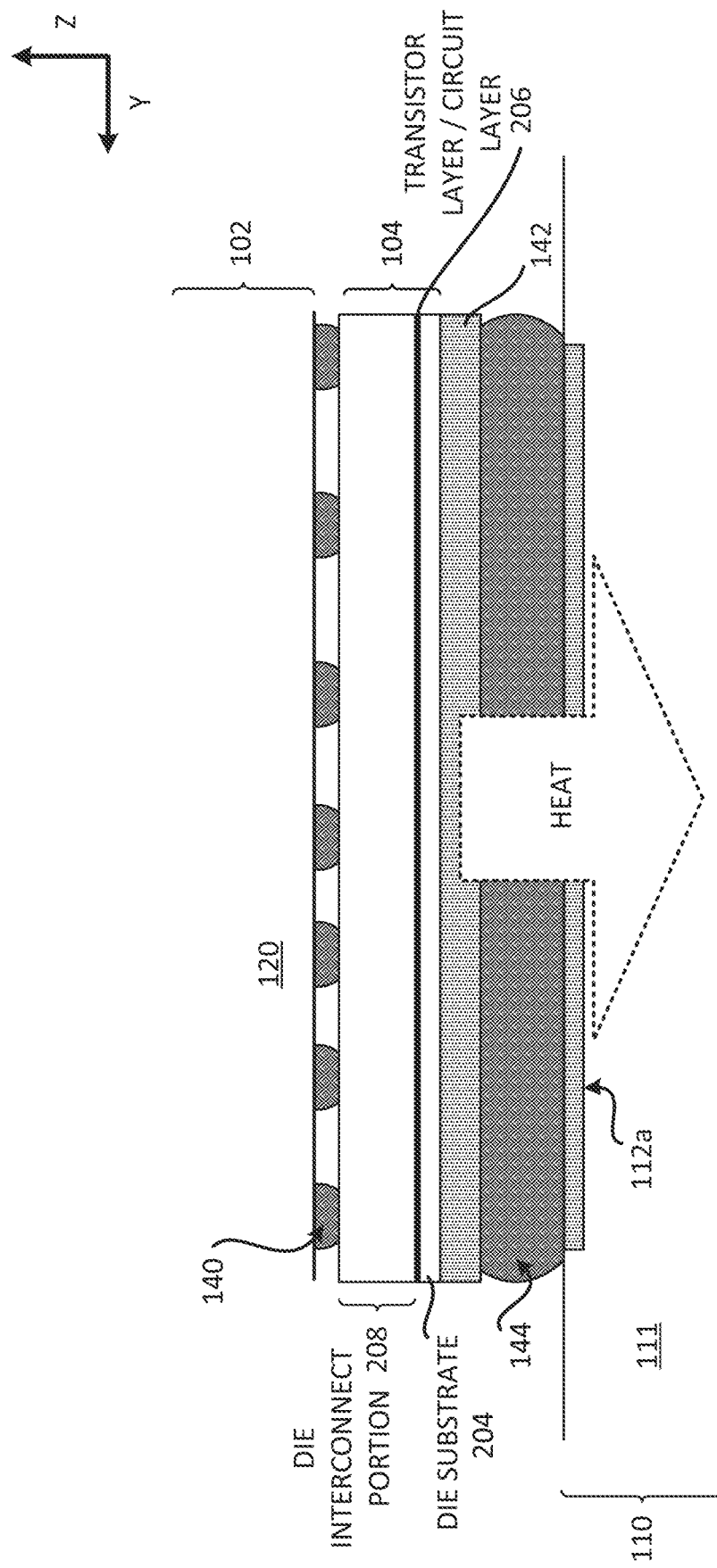
FIG. 2 illustrates an exemplary close-up view of a package that includes an integrated device with a back side metal layer.

FIG. 2 illustrates a close-up view of FIG. 1. In particular, FIG. 2 illustrates an example of how the back side of the integrated device 104 may be coupled to the board 110. As shown in FIG. 2, the integrated device 104 includes a die substrate 204, a circuit layer 206 and a die interconnect portion 208. The circuit layer 206 may be located over the die substrate 204. The circuit layer 206 may include transistors that are formed in and/or over the die substrate 204. The die interconnect portion 208 is coupled to the die substrate 204 and the circuit layer 206. The die interconnect portion 208 may be located over the die substrate 204 and the circuit layer 206. The die interconnect portion 208 includes at least one die dielectric layer and a plurality of die interconnects (both not shown). The plurality of die interconnects may be coupled to the circuit layer 206. For example, the plurality of die interconnects may be coupled to transistors of the circuit layer 206. The die substrate 204 may include silicon (Si). The part of the integrated device 104 that includes the die substrate 204 may be considered the back side of the integrated device 104. The back side metal layer 142 is coupled to the die substrate 204 of the integrated device 104. As mentioned above, the back side metal layer 142 may be considered part of the integrated device 104. The first solder interconnect 144 is coupled to the back side metal layer 142 and a board interconnect 112*a* of the board 110. The integrated device 104 and the board 110 are coupled to each other such that the integrated device 104 and the board 110 may be configured to dissipate heat from the integrated device 104 through the back side metal layer 142, the first solder interconnect 144 and the board interconnect 112*a*.

Figure 3:
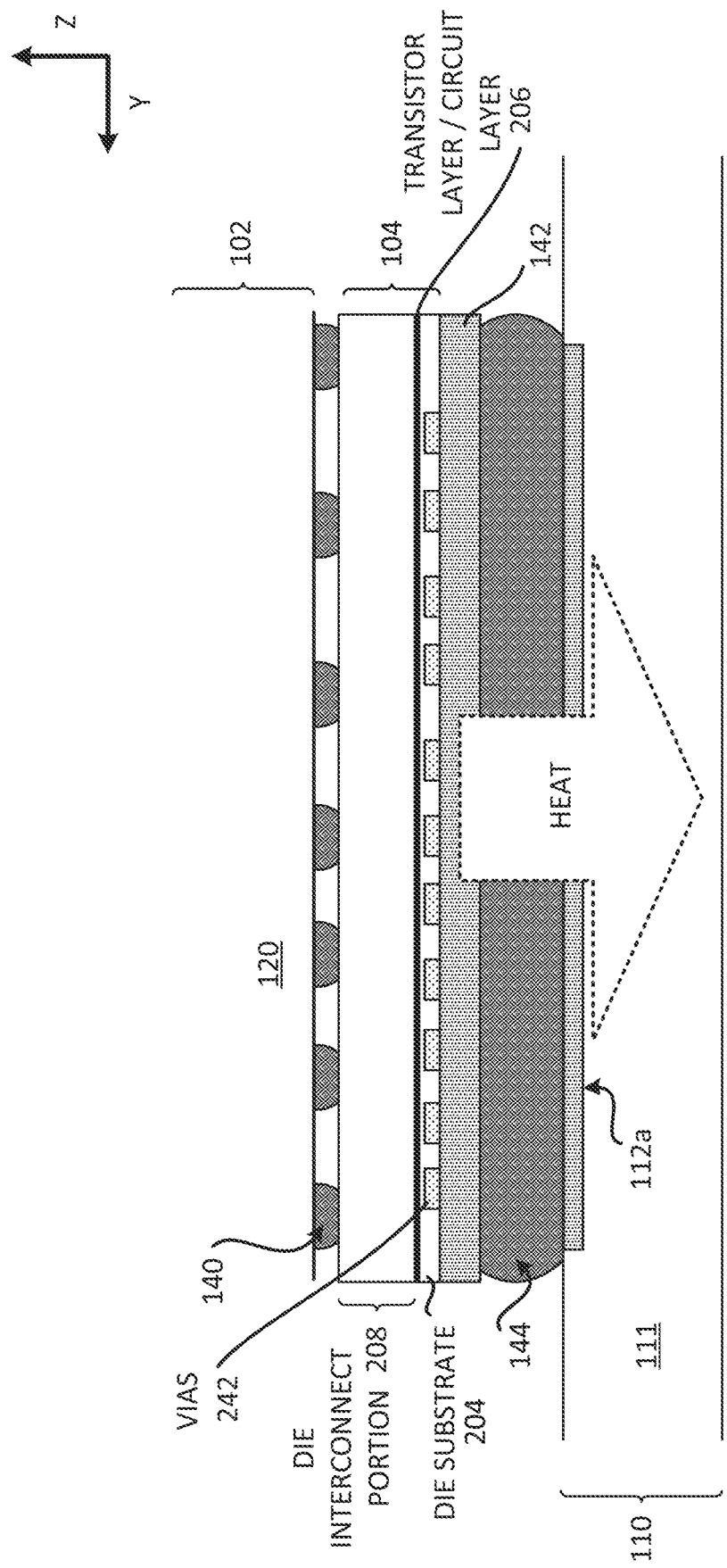
FIG. 3 illustrates an exemplary close-up view of a package that includes an integrated device with a back side metal layer.

FIG. 3 illustrates a close-up view of FIG. 1. In particular, FIG. 3 illustrates another example how the back side of the integrated device 104 may be coupled to the board 110. As shown in FIG. 3, the integrated device 104 includes a die substrate 204 and a plurality of die substrate vias 242. The plurality of die substrate vias 242 may partially and/or entirely extend through the thickness of the die substrate 204. The plurality of die substrate vias 242 may be configured to not be electrically coupled to any transistors of the integrated device 104. The plurality of die substrate vias 242 is coupled to the back side metal layer 142. The plurality of die substrate vias 242 may include a thermally conductive material (e.g., metal). The plurality of die substrate vias 242 may help provide better heat dissipation since the plurality of die substrate vias 242 may be a better heat conductor than the die substrate 204. The integrated device 104 and the board 110 are coupled to each other such that the integrated device 104 and the board 110 may be configured to dissipate heat from the integrated device 104 through the plurality of die substrate vias 242, the back side metal layer 142, the first solder interconnect 144 and the board interconnect 112*a*. The plurality of die substrate vias 242, the back side metal layer 142, the first solder interconnect 144 and the board interconnect 112*a* may be configured to be coupled to ground. The plurality of die substrate vias 242, the back side metal layer 142, the first solder interconnect 144 and the board interconnect 112*a* may be configured as an EMI shield for the integrated device 104 and/or the package 100.

Figure 4:
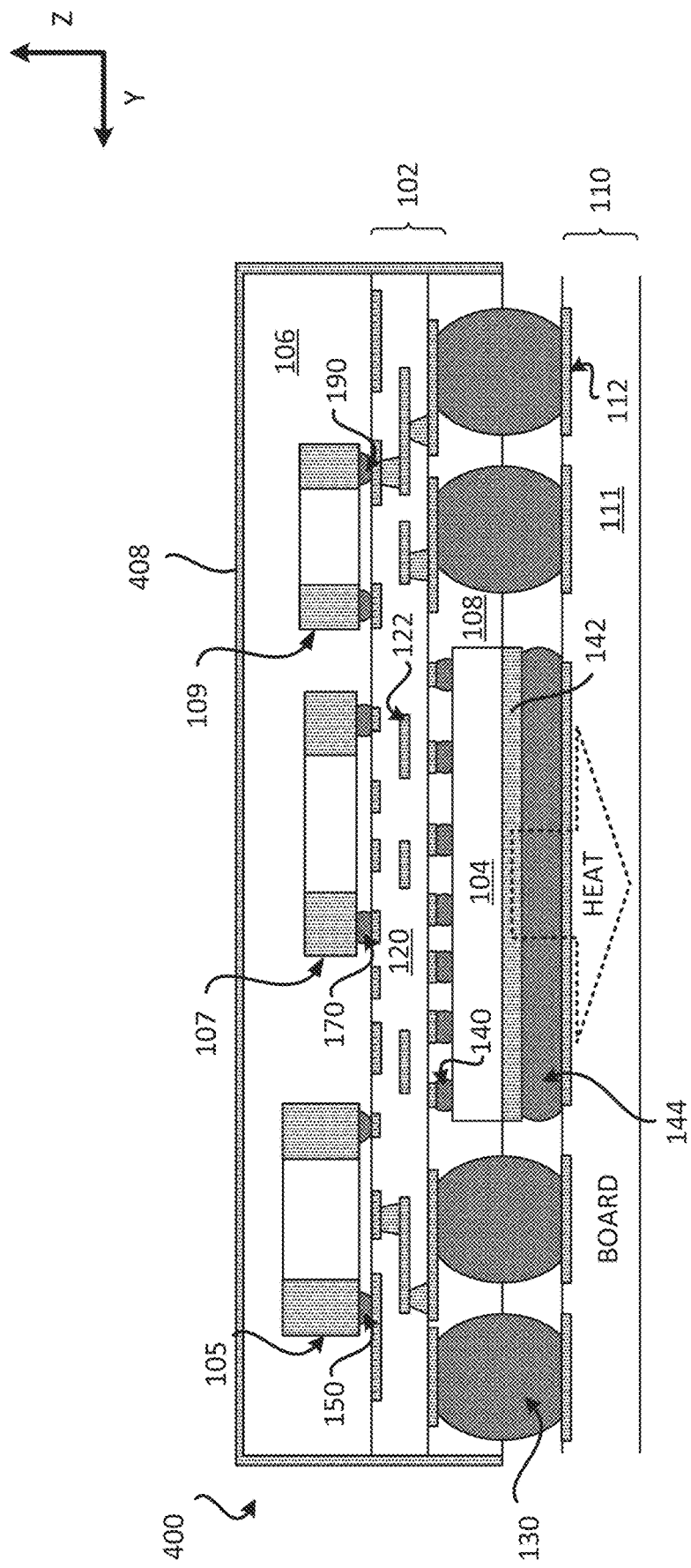
FIG. 4 illustrates an exemplary cross sectional profile view of a package that includes an integrated device with a back side metal layer.

In some implementations, a package may include additional components for added improvements in performance FIG. 4 illustrates a package 400 coupled to the board 110. The package 400 is similar to the package 100 and includes similar components and/or arrangements as the package 100. Thus, the description of the package 100 may be applicable to the package 400. The package 400 may improve on the package 100 with additional EMI shielding for the package 400 and/or the integrated device 104. The package 400 includes a metal layer 408 that is formed and located over a surface of the encapsulation layer 106, a side surface of the substrate 102 and/or a surface of the encapsulation layer 108. The metal layer 408 may be configured to be coupled to ground. The metal layer 408 may be configured as an EMI shield for the passive device(s) (e.g., 105, 107, 109), the integrated device 104 and/or the package 400. The metal layer 408 may be coupled to an interconnect from the plurality of interconnects 122. The metal layer 408 may be formed and located over an external surface of the package 400.

The disclosure describes the package 100 and the package 400 as being coupled to a board. However, the package 100 and the package 400 may be coupled to a substrate and/or an interposer in a similar manner. In some implementations, the package 100 and/or the package 400 may be implemented in a package on package (PoP).

An integrated device (e.g., 104) may include a die (e.g., semiconductor bare die). The integrated device may include a power management integrated circuit (PMIC). The integrated device may include an application processor. The integrated device may include a modem. The integrated device may include a radio frequency (RF) device, a passive device, a filter, a capacitor, an inductor, an antenna, a transmitter, a receiver, a gallium arsenide (GaAs) based integrated device, a surface acoustic wave (SAW) filters, a bulk acoustic wave (BAW) filter, a light emitting diode (LED) integrated device, a silicon (Si) based integrated device, a silicon carbide (SiC) based integrated device, a memory, power management processor, and/or combinations thereof. An integrated device (e.g., 104) may include at least one electronic circuit (e.g., first electronic circuit, second electronic circuit, etc. . . . ). An integrated device may include transistors. An integrated device may be an example of an electrical component and/or electrical device.

The package (e.g., 100, 400) may be implemented in a radio frequency (RF) package. The RF package may be a radio frequency front end (RFFE) package. A package (e.g., 100, 400) may be configured to provide Wireless Fidelity (WiFi) communication and/or cellular communication (e.g., 2G, 3G, 4G, 5G). The packages (e.g., 100, 400) may be configured to support Global System for Mobile (GSM) Communications, Universal Mobile Telecommunications System (UMTS), and/or Long-Term Evolution (LTE). The packages (e.g., 100, 400) may be configured to transmit and receive signals having different frequencies and/or communication protocols.

Having described various packages, a sequence for fabricating a package will now be described below.

Exemplary Sequence for Fabricating a Package Comprising an Integrated Device with Back Side Metal Layer In some implementations, fabricating a package includes several processes. FIGS. 5A-5E illustrate an exemplary sequence for providing or fabricating a package that includes an integrated device with a back side metal layer. In some implementations, the sequence of FIGS. 5A-5E may be used to provide or fabricate the package 400. However, the process of FIGS. 5A-5E may be used to fabricate any of the packages (e.g., 100) described in the disclosure.

It should be noted that the sequence of FIGS. 5A-5E may combine one or more stages in order to simplify and/or clarify the sequence for providing or fabricating a package. In some implementations, the order of the processes may be changed or modified. In some implementations, one or more of processes may be replaced or substituted without departing from the scope of the disclosure.

Figure 5A:
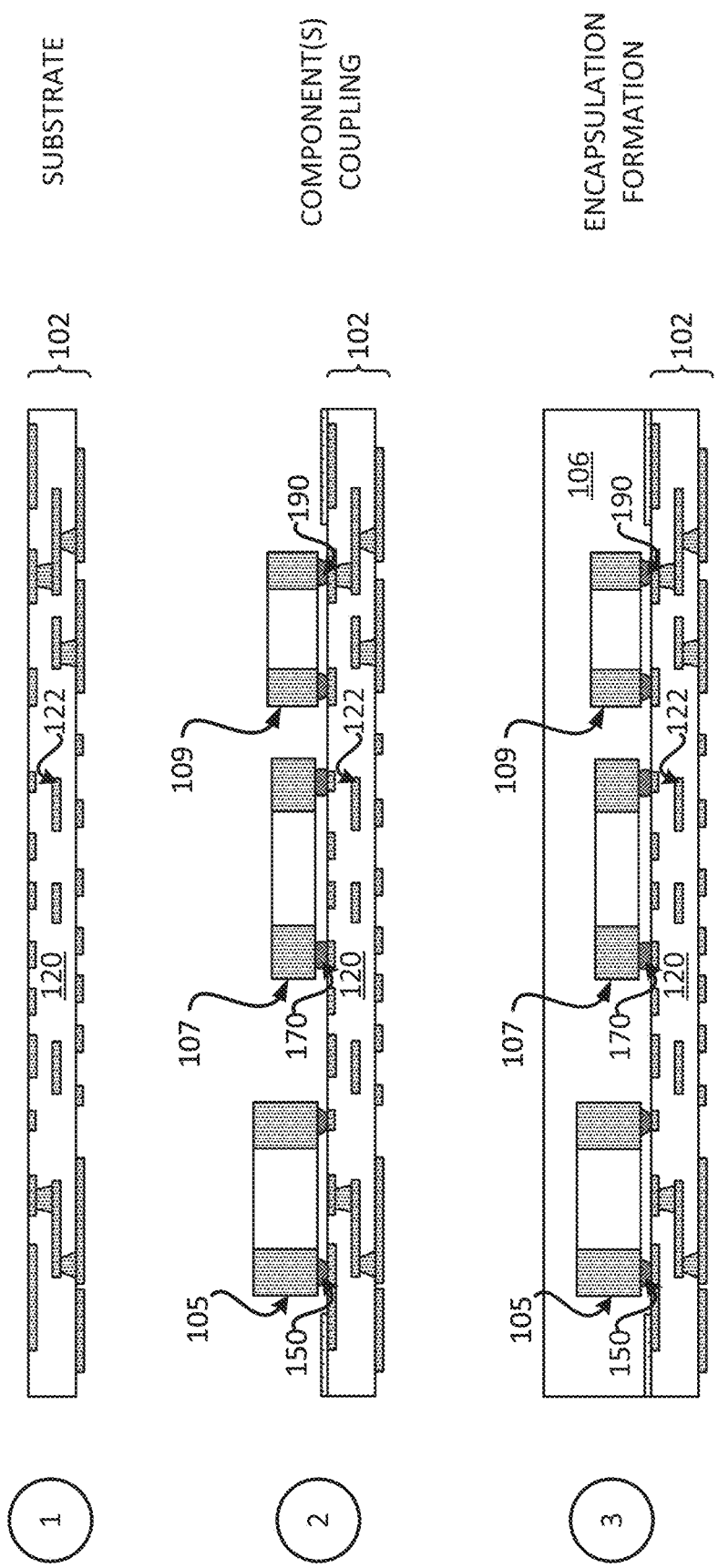
FIGS. 5A-5E illustrate an exemplary sequence for fabricating a package comprising an integrated device with a back side metal layer, and assembling the package to a board.

Stage 1, as shown in FIG. 5A illustrates a state after a substrate 102 is provided. The substrate 102 includes at least one dielectric layer 120 and a plurality of interconnects 122. The substrate 102 may include a first surface (e.g., top surface) and a second surface (e.g., bottom surface). The substrate 102 may be fabricated using the method as described in FIGS. 7A-7B. In some implementations, a cored substrate is provided (e.g., substrate that includes a core layer).

Stage 2 illustrates a state after a plurality of passive components (e.g., 105, 107, 109) are coupled to the first surface (e.g., top surface) of the substrate 102. A pick and place process may be used to couple to the passive components (e.g., 105, 107, 109) to the substrate 102. The passive components 105 may be coupled to the substrate 102 through the plurality of solder interconnects 150. The passive components 107 may be coupled to the substrate 102 through the plurality of solder interconnects 170. The passive components 109 may be coupled to the substrate 102 through the plurality of solder interconnects 190.

Stage 3 illustrates a state after an encapsulation layer 106 is provided (e.g., formed) over the first surface of the substrate 102. The encapsulation layer 106 may encapsulate the passive components (e.g., 105, 107, 109). The encapsulation layer 106 may include a mold, a resin and/or an epoxy. A compression molding process, a transfer molding process, or a liquid molding process may be used to form the encapsulation layer 106. The encapsulation layer 106 may be photo etchable. The encapsulation layer 106 may be a means for encapsulation.

Figure 5B:
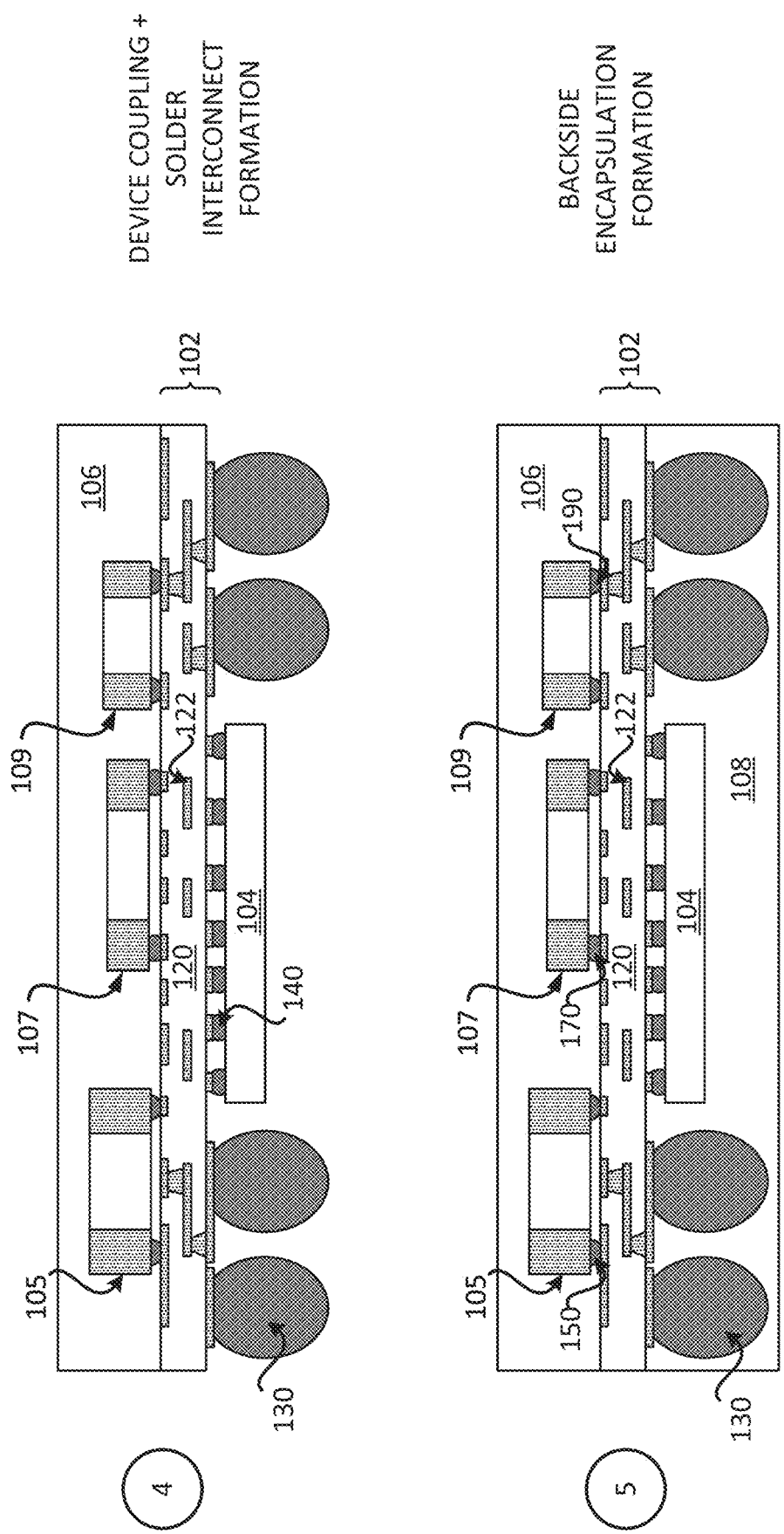

Stage 4, as shown in FIG. 5B, illustrates a state after the integrated device 104 is coupled to the second surface (e.g., bottom surface) of the substrate 102 through the plurality of solder interconnects 140. A solder reflow process may be used to couple the integrated device 104 to the substrate 102. FIG. 2 illustrates an example of how the integrated device 104 may be coupled to the substrate 102. Different implementations may couple different components and/or devices to the substrate 102. Stage 4 also illustrates a plurality of solder interconnects 130 coupled to the second surface of the substrate 102. A solder reflow process may be used to couple the plurality of solder interconnects 130 to the substrate 102.

Stage 5 illustrates a state after an encapsulation layer 108 is provided (e.g., formed) over the second surface (e.g., bottom surface) of the substrate 102. The encapsulation layer 108 may encapsulate the integrated device 104 and the plurality of solder interconnects 130. The encapsulation layer 108 may include a mold, a resin and/or an epoxy. A compression molding process, a transfer molding process, or a liquid molding process may be used to form the encapsulation layer 108. The encapsulation layer 108 may be photo etchable. The encapsulation layer 108 may be a means for encapsulation.

Figure 5C:
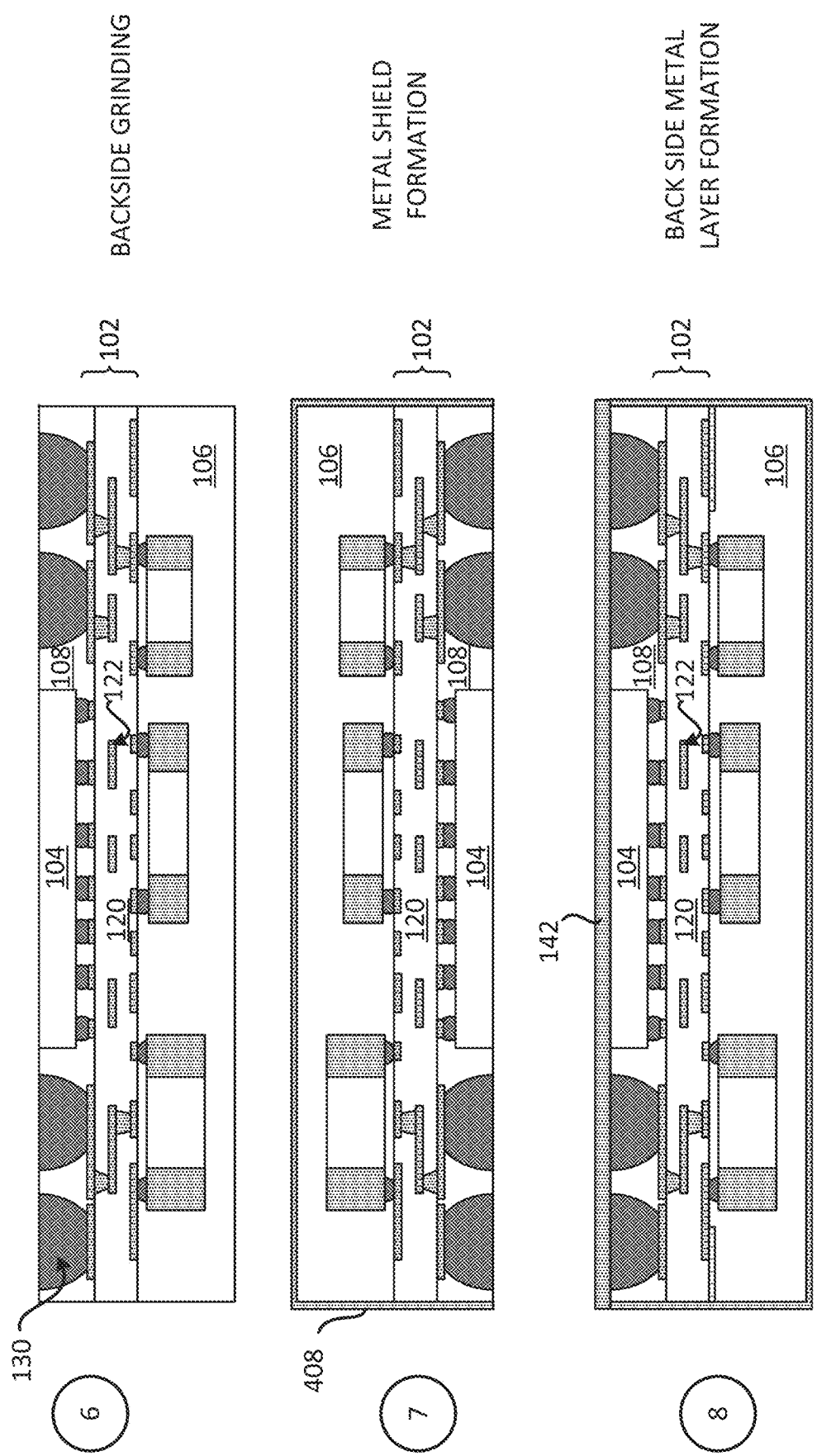

Stage 6, as shown in FIG. 5C, illustrates a state after a back side of the package is removed. For example, portions of the encapsulation layer 108 may be removed through a grinding process, and portions of the plurality of solder interconnects 130 may be removed through a grinding process. Removing portions of the encapsulation layer 108 may expose a back side of the integrated device 104. In some implementations, portions of the back side of the integrated device 104 may be removed as well. For example, portions of the die substrate 204 of the integrated device 104 may be removed. The surface of the encapsulation layer 108 may be planar with the back side surface of the integrated device 104 after the grinding process.

Stage 7 illustrates a state after a metal layer 408 is formed over the surface of the encapsulation layer 106, a side surface of the substrate 102 and a side surface of the encapsulation layer 108. A sputtering process or a plating process may be used to form the metal layer 408. The metal layer 408 may include stainless steel (SUS) and/or copper (Cu). However, the metal layer 408 may include any type of electrically conductive material. The metal layer 408 may be configured as an EMI shield.

Stage 8 illustrates a state after a back side metal layer 142 is formed over the back side of the integrated device 104. A sputtering process and/or a plating process may be used to form the back side metal layer 142. In some implementations, as will be further described below in FIGS. 6A-6B, a mask may be used to form the back side metal layer 142. The back side metal layer 142 may also be formed over the encapsulation layer 108. The back side metal layer 142 may include stainless steel (SUS), copper (Cu), palladium (Pd), and/or gold (Au). However, the back side metal layer 142 may include any type of electrically conductive material and/or thermally conductive material. In some implementations, the back side metal layer 142 may be formed through selective plating, such as electroless plating.

Figure 5D:
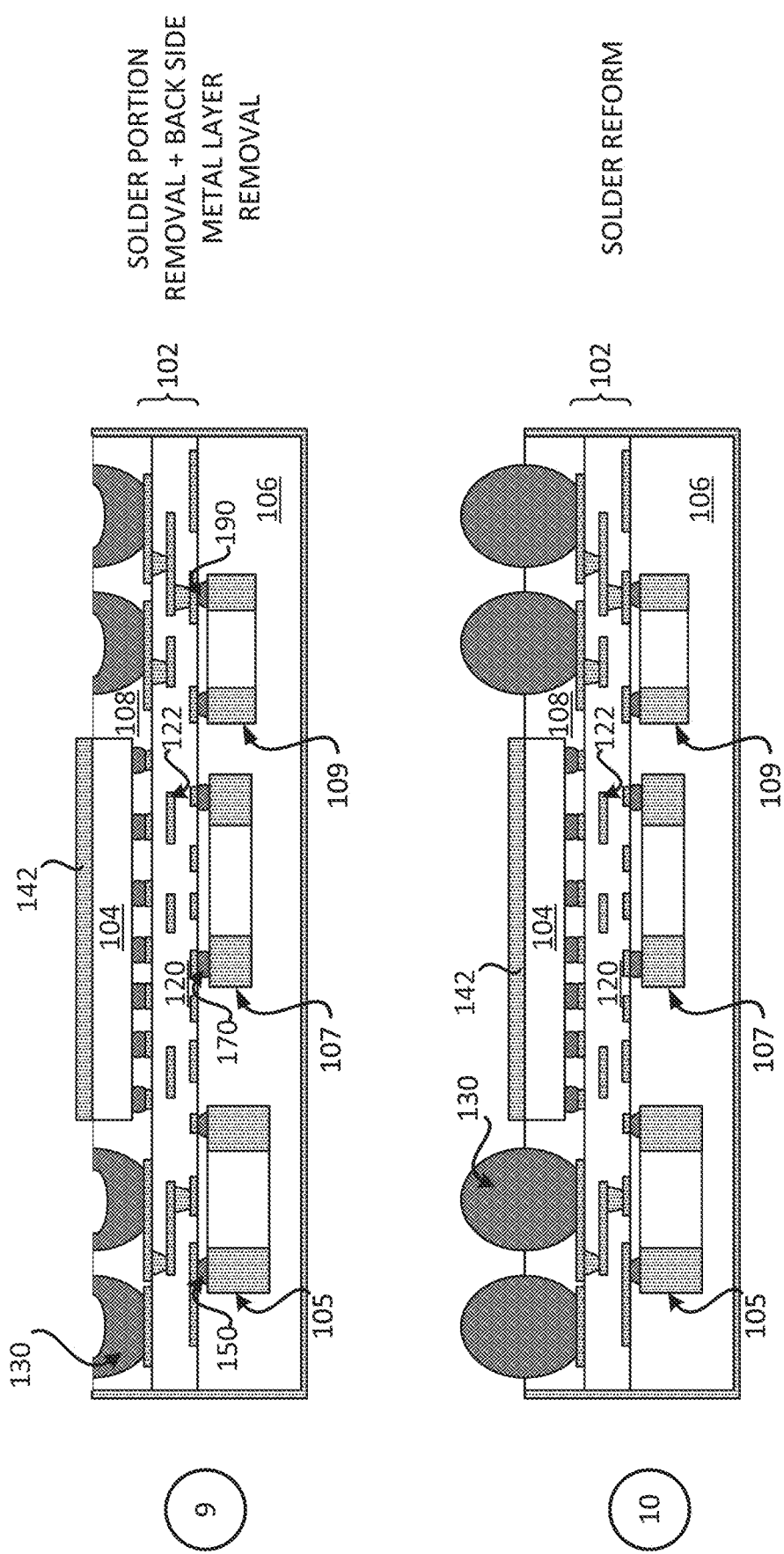

Stage 9, as shown in FIG. 5D, illustrates a state after portions of the back side metal layer 142 are removed. In some implementations, portions of the back side metal layer 142 may be removed to ensure that the back side metal layer 142 is not in contact with an interconnect that is part of the circuit of the package and/or the integrated device. In some implementations, during a sputtering process, portions of the back side metal layer 142 may spill to a nearby solder interconnect causing an unintended connection. A laser process may be used to separate the back side metal layer 142 form any unintended connection. A laser process (e.g., laser ablation) may also be used to form cavities in the plurality of solder interconnects 130.

Stage 10 illustrates a state after additional solder interconnects may be added to reform the plurality of solder interconnects 130. Portions of the additional solder interconnects may be formed in the cavities of the solder interconnects that were formed at stage 9. A solder reflow process may be used to form additional solder interconnects.

Figure 5E:
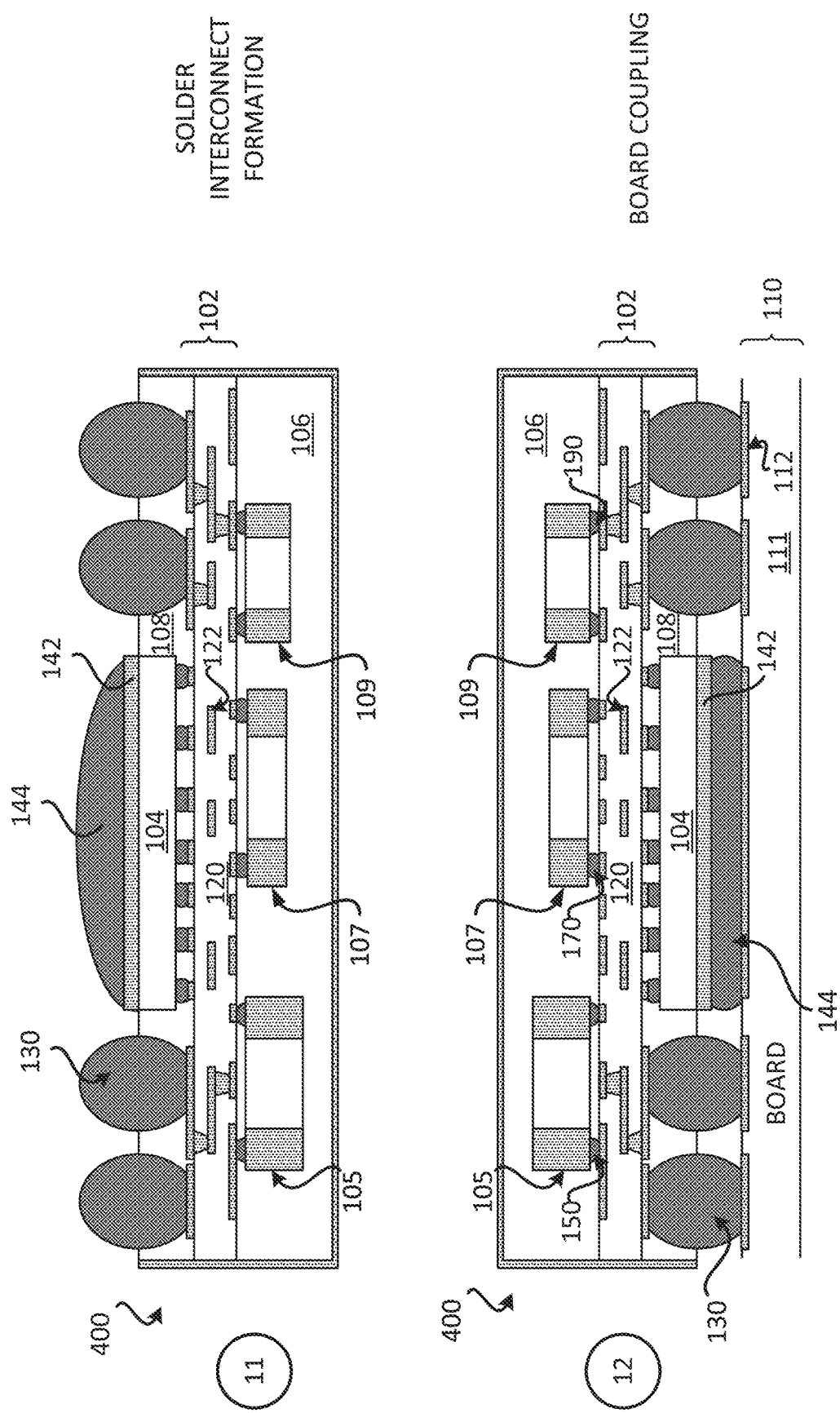

Stage 11, as shown in FIG. 5E, illustrates a state a first solder interconnect 144 is coupled to the back side metal layer 142. A solder reflow process may be used to form and couple the first solder interconnect 144 to the back side metal layer 142. Stage 11 may illustrate the package 400 that includes an integrated device 104, a back side metal layer 142 coupled to the back side of the integrated device 104, and a first solder interconnect 144 coupled to the back side metal layer 142.

Once the package 400 is fabricated, the package 400 may be assembled with other components. For example, the package 400 may be coupled to a board 110. The coupling of the package 400 to a board 110 may be done separately from the fabrication of the package 400. The assembly of the package 400 to the board 110 may be done by the same entity that fabricated the package 400, or a different entity than the entity that fabricated the package 400.

Stage 12 illustrates a state after the package 400 is coupled to the board 110 through the plurality of solder interconnects 130 and the first solder interconnect 144. The plurality of solder interconnects 130 and the first solder interconnect 144 are coupled to the plurality of board interconnects 112 of the board 110. The package 400 and the board 110 are coupled together such that the package 400 and the board 110 are configured to dissipate heat from the integrated device 104 through the back side metal layer 142, the first solder interconnect 144, and at least one board interconnect from the plurality of board interconnects 112. If the integrated device 104 includes die substrate vias 242, as illustrated and described in FIG. 3, the package 400 and the board 110 are configured to dissipate heat from the integrated device 104 through the die substrate vias 242, the back side metal layer 142, the first solder interconnect 144, and at least one board interconnect from the plurality of board interconnects 112.

The packages (e.g., 100, 400) described in the disclosure may be fabricated one at a time or may be fabricated together as part of one or more wafers and then singulated into individual packages.

Figure 6A:
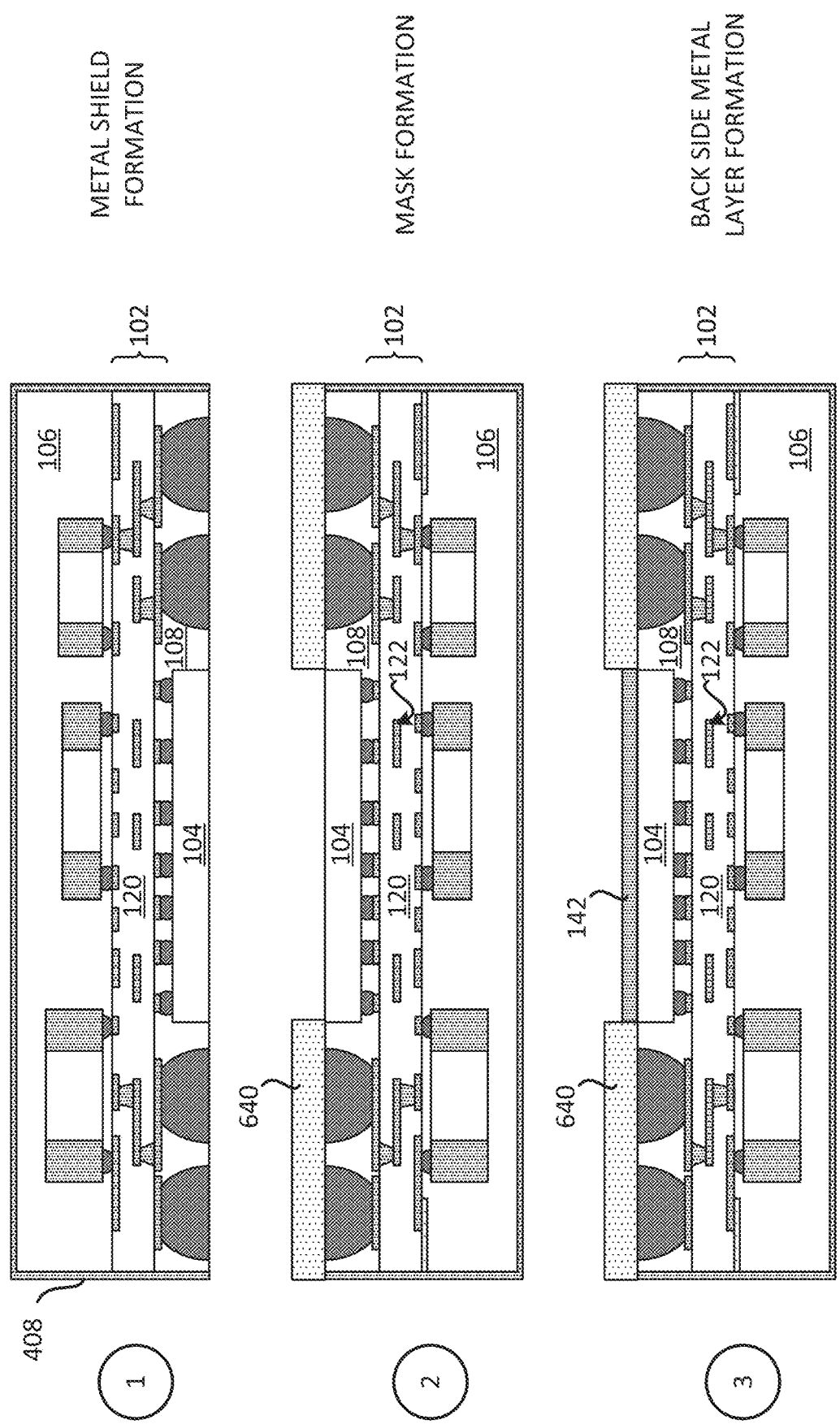
FIGS. 6A-6B illustrate an exemplary sequence for fabricating a package comprising an integrated device with a back side metal layer, and assembling the package to a board.
Figure 6B:
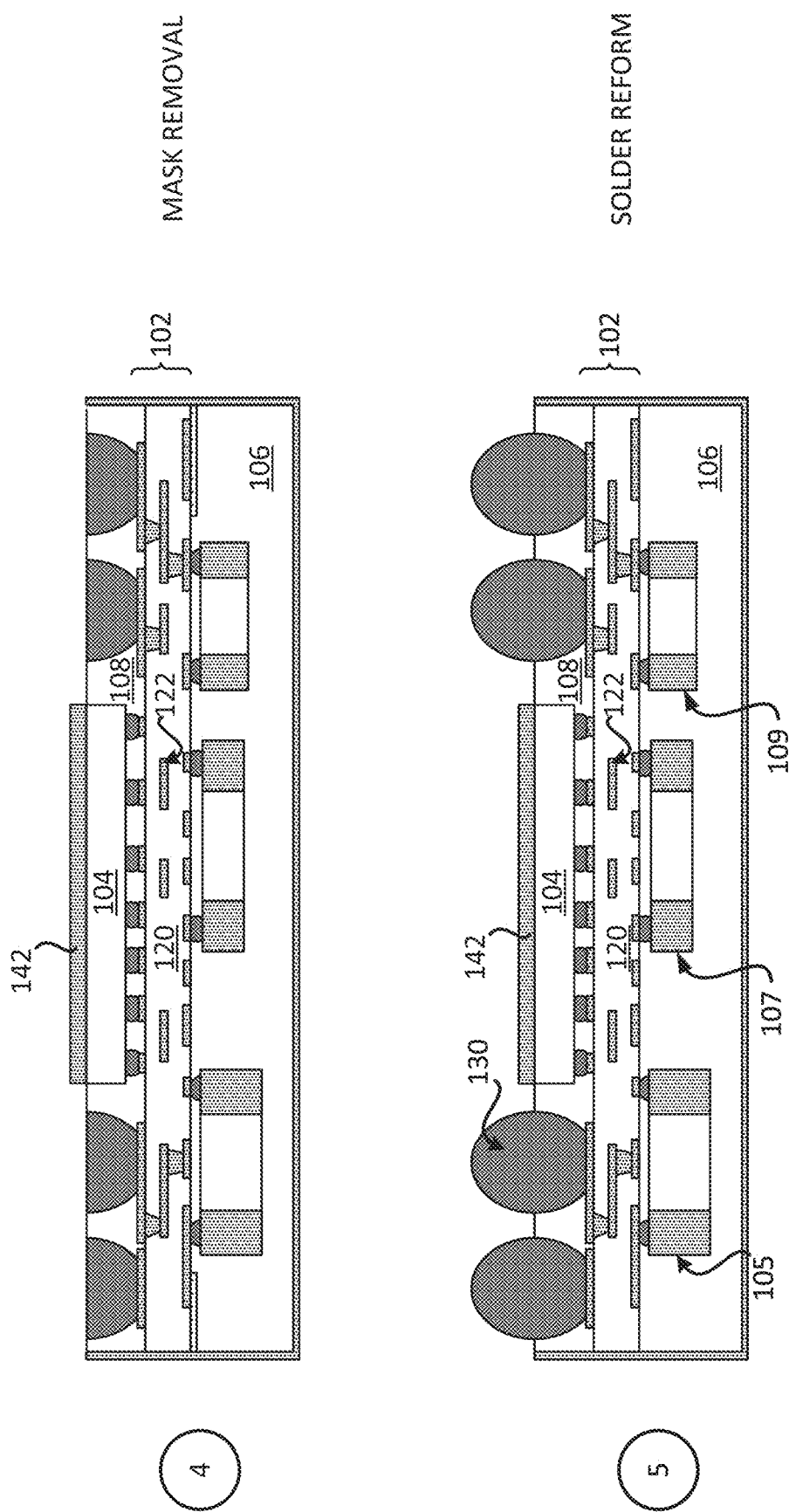

In some implementations, the back side metal layer 142 may be formed differently than how it is described in FIGS. 5A-5E. FIGS. 6A-6B illustrate part of an exemplary sequence for providing or fabricating a package that includes an integrated device with a back side metal layer. The sequence shown in FIGS. 6A-6B may replace the sequence of Stages 7-10 of FIGS. 5C-5D.

Stage 1 of FIG. 6A, illustrates a state after a metal layer 408 is formed over the surface of the encapsulation layer 106, a side surface of the substrate 102 and a side surface of the encapsulation layer 108. A sputtering process or a plating process may be used to form the metal layer 408. The metal layer 408 may include stainless steel (SUS) and/or copper (Cu). However, the metal layer 408 may include any type of electrically conductive material. The metal layer 408 may be configured as an EMI shield. Stage 1 of FIG. 6A may be similar to Stage 7 of FIG. 5C.

Stage 2 illustrates a state after a mask 640 is formed over the back side of the integrated device 104. A deposition process may be used to form the mask 640. The mask 640 may be etched and/or patterned. The mask 640 may be formed over the encapsulation layer 108.

Stage 3 illustrates a state after a back side metal layer 142 is formed over the back side of the integrated device 104. A sputtering process and/or a plating process may be used to form the back side metal layer 142. The back side metal layer 142 may be formed through one or more openings in the mask 640. The back side metal layer 142 may include stainless steel (SUS), copper (Cu), palladium (Pd), and/or gold (Au). However, the back side metal layer 142 may include any type of electrically conductive material and/or thermally conductive material.

Stage 4 of FIG. 6B, illustrates a state after the mask 640 has been removed. A rinsing process may be used to remove the mask 640. Stages 2-4 of FIGS. 6A-6B may replace stages 8-9 of FIGS. 5C-5D.

Stage 5 illustrates a state after additional solder interconnects may be added to reform the plurality of solder interconnects 130. Portions of the additional solder interconnects may be formed in the cavities of the solder interconnects that were formed at stage 9. A solder reflow process may be used to form additional solder interconnects. Stage 5 of FIG. 6B may be similar to Stage 10 of FIG. 5D. In some implementations, cavities may be formed in the solder interconnects before the plurality of solder interconnects 130, as described for example, in Stage 9 of FIG. 5D.

Figure 7:
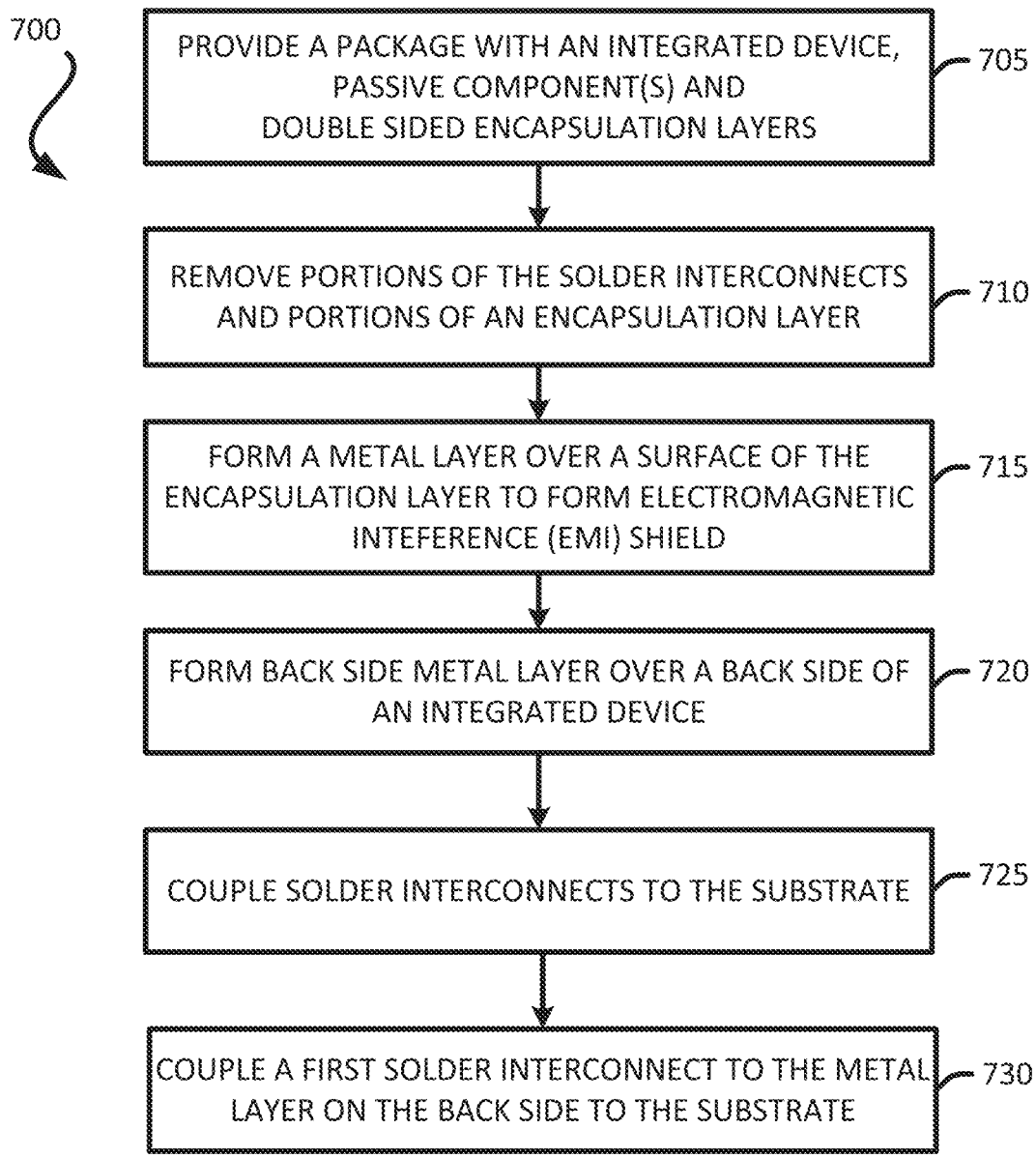
FIG. 7 illustrates an exemplary flow chart of a method for fabricating a package comprising an integrated device with a back side metal layer, and assembling the package to a board.

Exemplary Flow Diagram of a Method for Fabricating a Package Comprising an Integrated Device with Back Side Metal Layer In some implementations, fabricating a package includes several processes. FIG. 7 illustrates an exemplary flow diagram of a method 700 for providing or fabricating a package comprising an integrated device with a back side metal layer. In some implementations, the method 700 of FIG. 7 may be used to provide or fabricate the package 400 described in the disclosure. However, the method 700 may be used to provide or fabricate any of the packages (e.g., 100) described in the disclosure.

It should be noted that the method of FIG. 7 may combine one or more processes in order to simplify and/or clarify the method for providing or fabricating a package. In some implementations, the order of the processes may be changed or modified.

The method provides (at 705) a package (e.g., 400, 100) that includes a substrate (e.g., 102), passive components (e.g., 105, 107, 109), an integrated device 104, an encapsulation layer 106, an encapsulation layer 108, and a plurality of solder interconnects 130. The package may be a double-sided molded package. The package may be provided by a supplier or fabricated. Stages 1-5 of FIGS. 5A-5B illustrate and describe an example of how a package may be provided or fabricated.

The method removes (at 710) portions of the plurality of solder interconnects 130 and portions of the encapsulation layer 108. A grinding process may be used to remove portions of the plurality of solder interconnects 130 and portions of the encapsulation layer 108. Removing portions of the encapsulation layer 108 may expose a back side of the integrated device 104. The surface of the encapsulation layer 108 may be planar with the back side surface of the integrated device 104 after the grinding process. Stage 6 of FIG. 5C, illustrates and describes an example of removing portions of solder interconnects and portions of an encapsulation layer.

The method forms (at 715) a metal layer (e.g., 408) over the surface of the encapsulation layer 106, a side surface of the substrate 102 and a side surface of the encapsulation layer 108. A sputtering process or a plating process may be used to form the metal layer 408. The metal layer 408 may include stainless steel (SUS) and/or copper (Cu). However, the metal layer 408 may include any type of electrically conductive material. The metal layer 408 may be configured as an EMI shield. Stage 7 of FIG. 5C, illustrates and describes an example of a metal layer that is formed over the surface of an encapsulation layer, a side surface of the substrate and a side surface of the encapsulation layer.

The method forms (at 720) a back side metal layer (e.g., 142) over a back side of the integrated device 104. A sputtering process and/or a plating process may be used to form the back side metal layer 142. In some implementations, a mask (not shown) may be used to form the back side metal layer 142. The back side metal layer 142 may also be formed over the encapsulation layer 108. The back side metal layer 142 may include stainless steel (SUS), copper (Cu), palladium (Pd), and/or gold (Au). However, the back side metal layer 142 may include any type of electrically conductive material and/or thermally conductive material. Stage 8 of FIG. 5C illustrates and describes an example of a back side metal layer formed over the back side of an integrated device. In some implementations, after the back side metal layer is formed, portions of the back side metal layer 142 may be removed to ensure that the back side metal layer 142 is not in contact with an interconnect that is part of the circuit of the package and/or the integrated device. This may be necessary when during a sputtering process, portions of the back side metal layer 142 may spill to a nearby solder interconnect causing an unintended connection. A laser process may be used to remove portions of the back side metal layer 142. In some implementations, the laser process may also be used to form cavities in the plurality of solder interconnects 130. Stage 9 of FIG. 5D, illustrates and describes an example of removing portions a back side metal layer and forming cavities in solder interconnects.

The method couples (at 725) solder interconnects (e.g., 130) to the substrate 102. For example, additional solder interconnects 130 may be added to reform the plurality of solder interconnects 130. Portions of the additional solder interconnects may be formed in the cavities of the solder interconnects that were formed (at 720). A solder reflow process may be used to form additional solder interconnects. Stage 10 of FIG. 5D, illustrates and describes an example of adding and coupling solder interconnects to the substrate.

The method couples (at 730) a first solder interconnect (e.g., 144) to the back side metal layer 142. A solder reflow process may be used to form and couple the first solder interconnect 144 to the back side metal layer 142. Stage 11 of FIG. 5E, illustrates and describes an example of a first solder interconnect coupled to the back side metal layer.

The packages (e.g., 100, 400) described in the disclosure may be fabricated one at a time or may be fabricated together as part of one or more wafers and then singulated into individual packages.

Exemplary Sequence for Fabricating a Substrate

Figure 8A:
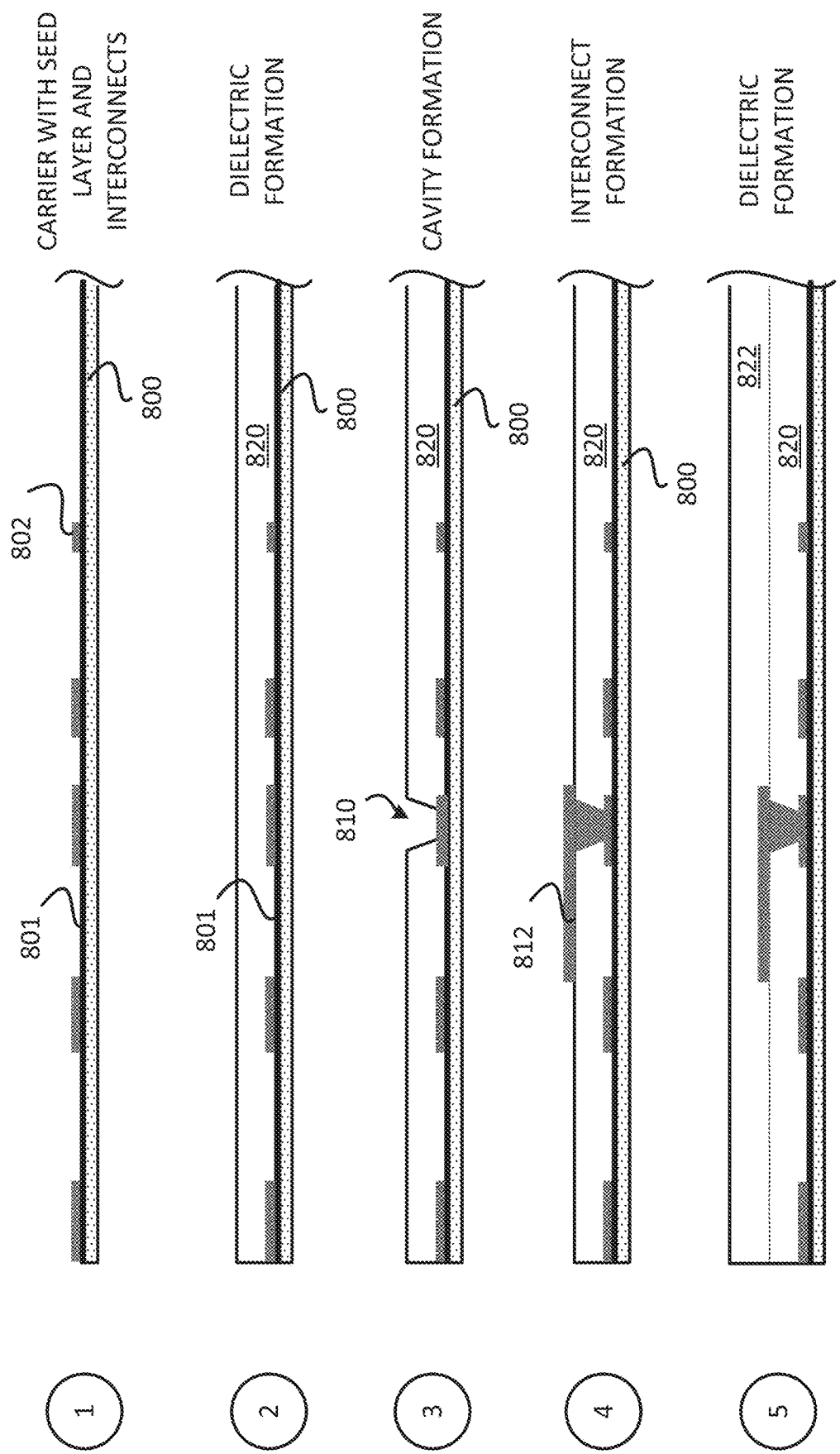
FIGS. 8A-8B illustrate an exemplary sequence for fabricating a substrate.
Figure 8B:
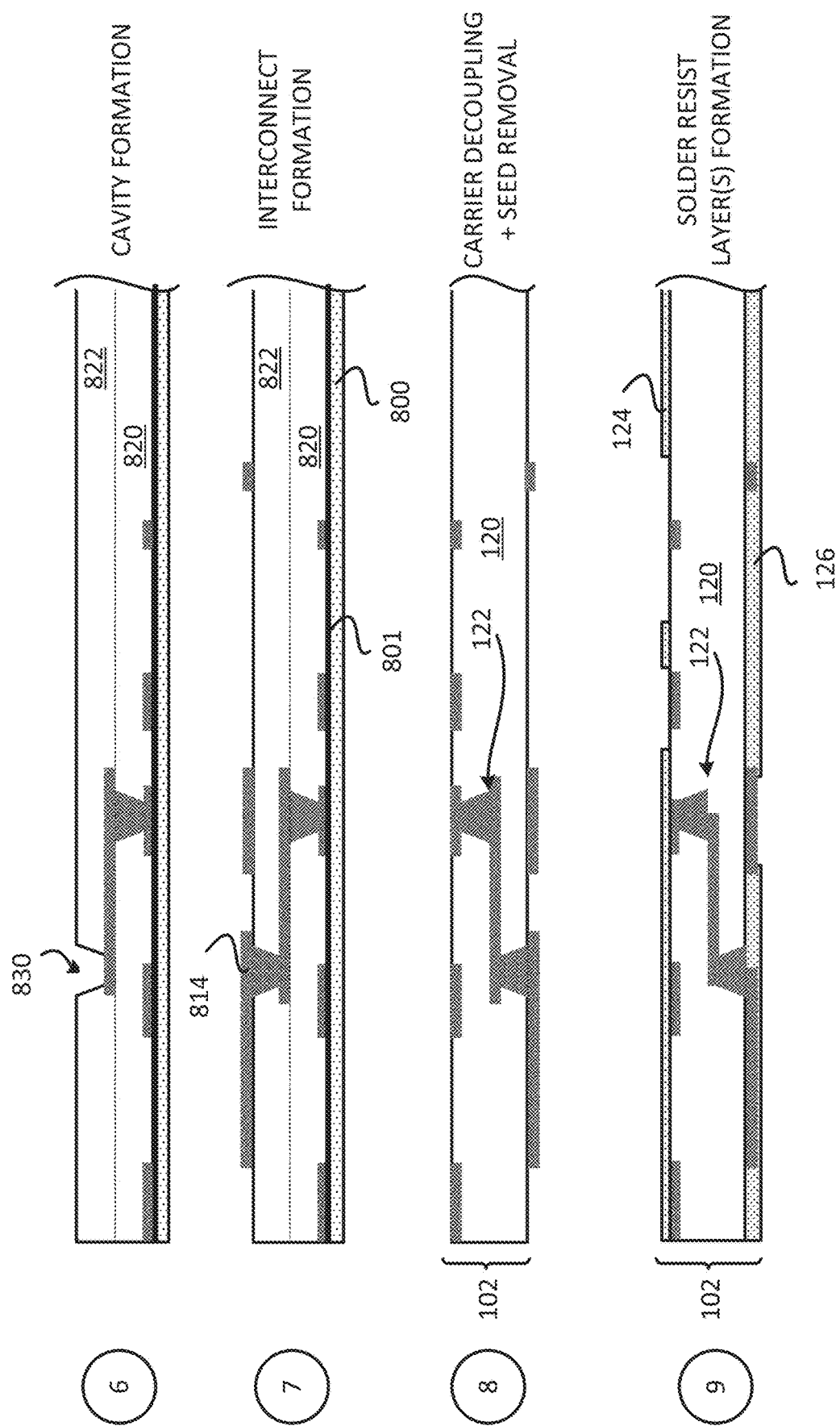

In some implementations, fabricating a substrate includes several processes. FIGS. 8A-8B illustrate an exemplary sequence for providing or fabricating a substrate. In some implementations, the sequence of FIGS. 8A-8B may be used to provide or fabricate the substrate 102. However, the process of FIGS. 8A-8B may be used to fabricate any of the substrates described in the disclosure.

It should be noted that the sequence of FIGS. 8A-8B may combine one or more stages in order to simplify and/or clarify the sequence for providing or fabricating a substrate. In some implementations, the order of the processes may be changed or modified. In some implementations, one or more of processes may be replaced or substituted without departing from the scope of the disclosure.

Stage 1, as shown in FIG. 8A, illustrates a state after a carrier 800 is provided. A seed layer 801 and interconnects 802 may be located over the carrier 800. The interconnects 802 may be located over the seed layer 801. A plating process and etching process may be used to form the interconnects 802. In some implementations, the carrier 800 may be provided with the seed layer 801 and a metal layer that is patterned to form the interconnects 802. The interconnects 802 may represent at least some of the interconnects from the plurality of interconnects 122.

Stage 2 illustrates a state after a dielectric layer 820 is formed over the carrier 800, the seed layer 801 and the interconnects 802. A deposition and/or lamination process may be used to form the dielectric layer 820. The dielectric layer 820 may include prepreg and/or polyimide. The dielectric layer 820 may include a photo-imagable dielectric. However, different implementations may use different materials for the dielectric layer.

Stage 3 illustrates a state after a plurality of cavities 810 is formed in the dielectric layer 820. The plurality of cavities 810 may be formed using an etching process (e.g., photo etching process) or laser process.

Stage 4 illustrates a state after interconnects 812 are formed in and over the dielectric layer 820, including in and over the plurality of cavities 810. For example, a via, pad and/or traces may be formed. A plating process may be used to form the interconnects.

Stage 5 illustrates a state after a dielectric layer 822 is formed over the dielectric layer 820 and the interconnects 812. A deposition and/or lamination process may be used to form the dielectric layer 822. The dielectric layer 822 may include prepreg and/or polyimide. The dielectric layer 822 may include a photo-imagable dielectric. However, different implementations may use different materials for the dielectric layer.

Stage 6, as shown in FIG. 8B, illustrates a state after a plurality of cavities 830 is formed in the dielectric layer 822. The plurality of cavities 830 may be formed using an etching process (e.g., photo etching process) or laser process.

Stage 7 illustrates a state after interconnects 814 are formed in and over the dielectric layer 822, including in and over the plurality of cavities 830. For example, a via, pad and/or traces may be formed. A plating process may be used to form the interconnects. The plurality of interconnects 802, the plurality of interconnects 812, and/or the plurality of interconnects 814 may be represented by the plurality of interconnects 122. The dielectric layer 820 and/or the dielectric layer 822 may be represented by the at least one dielectric layer 120. The at least one dielectric layer 120 may include a photo-imagable dielectric. The at least one dielectric layer 120 may include prepreg and/or polyimide.

Stage 8 illustrates a state after the carrier 800 is decoupled (e.g., detached, removed, grinded out) from at least one dielectric layer 120 and the seed layer 801, portions of the seed layer 801 are removed (e.g., etched out), leaving the substrate 102 that includes at least one dielectric layer 120 and the plurality of interconnects 122.

In some implementations, a substrate may include solder resist layer(s). Stage 9 illustrates a state after the solder resist layer 124 and the solder resist layer 126 are formed over the substrate 102. A deposition process may be used to form the solder resist layer 124 and the solder resist layer 126. In some implementations, none or one solder resist layer may be formed over the at least one dielectric layer 120.

Different implementations may use different processes for forming the metal layer(s) and/or interconnects. In some implementations, a chemical vapor deposition (CVD) process, a physical vapor deposition (PVD) process, a sputtering process, a spray coating process, and/or a plating process may be used to form the metal layer(s).

Exemplary Flow Diagram of a Method for Fabricating a Substrate

Figure 9:
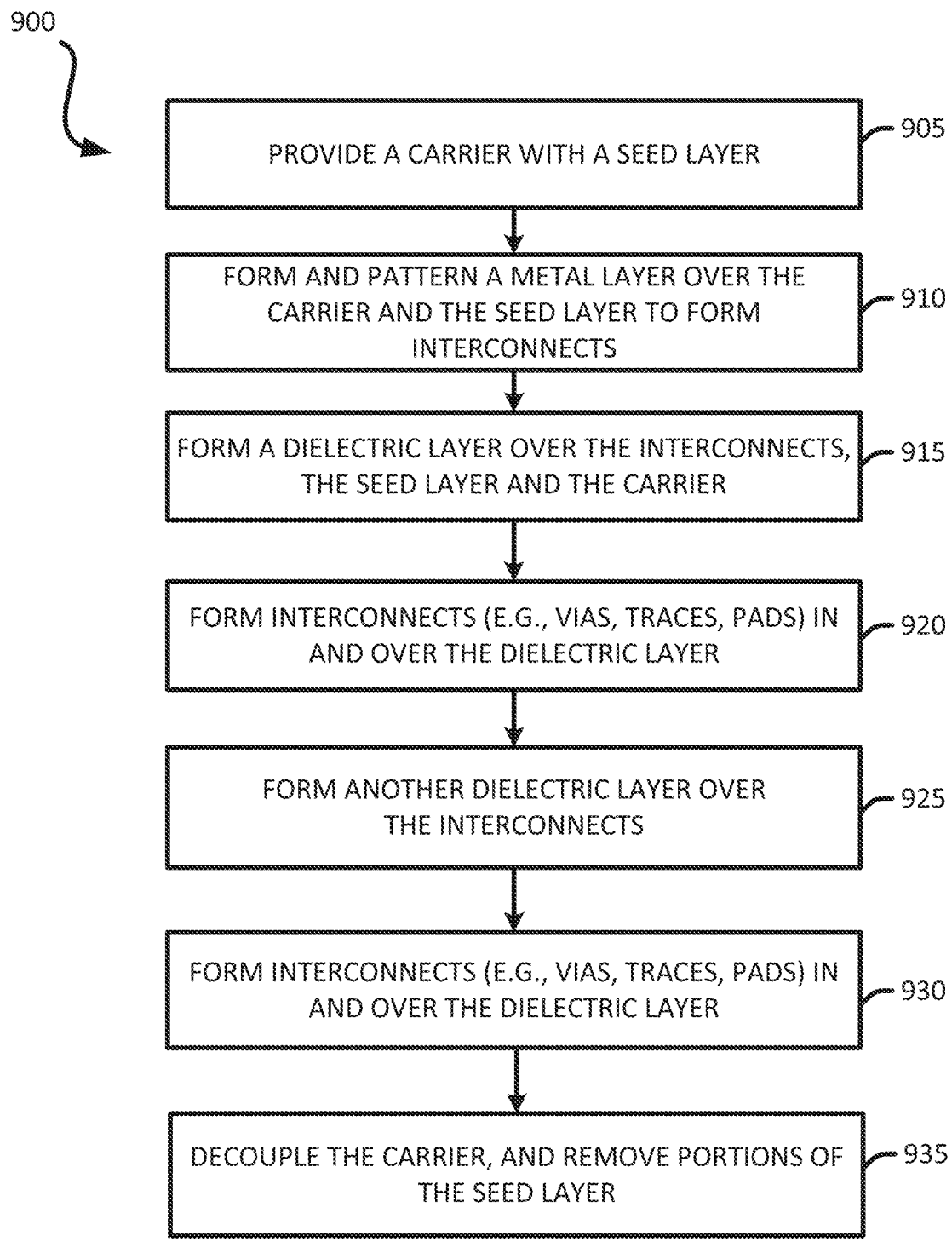
FIG. 9 illustrates an exemplary flow chart of a method for fabricating a substrate.

In some implementations, fabricating a substrate includes several processes. FIG. 9 illustrates an exemplary flow diagram of a method 900 for providing or fabricating a substrate. In some implementations, the method 900 of FIG. 9 may be used to provide or fabricate the substrate(s) of FIGS. 1-4. For example, the method 900 of FIG. 9 may be used to fabricate the substrate 102.

It should be noted that the method 900 of FIG. 9 may combine one or more processes in order to simplify and/or clarify the method for providing or fabricating a substrate. In some implementations, the order of the processes may be changed or modified.

The method provides (at 905) a carrier (e.g., 800). Different implementations may use different materials for the carrier 800. The carrier 800 may include a seed layer (e.g., 801). The seed layer 801 may include a metal (e.g., copper). The carrier may include a substrate, glass, quartz and/or carrier tape. Stage 1 of FIG. 8A illustrates and describes an example of a carrier with a seed layer that is provided.

The method forms and patterns (at 910) interconnects over the carrier 800 and the seed layer 801. A metal layer may be patterned to form interconnects. A plating process may be used to form the metal layer and interconnects. In some implementations, the carrier and seed layer may include a metal layer. The metal layer is located over the seed layer and the metal layer may be patterned to form interconnects (e.g., 402). Stage 1 of FIG. 8A illustrates and describes an example of forming and patterning interconnects over a seed layer and a carrier.

The method forms (at 915) a dielectric layer 820 over the seed layer 801, the carrier 800 and the interconnects 802. A deposition and/or lamination process may be used to form the dielectric layer 820. The dielectric layer 820 may include prepreg and/or polyimide. The dielectric layer 820 may include a photo-imagable dielectric. Forming the dielectric layer 820 may also include forming a plurality of cavities (e.g., 810) in the dielectric layer 820. The plurality of cavities may be formed using an etching process (e.g., photo etching) or laser process. Stages 2-3 of FIG. 8A illustrate and describe an example of forming a dielectric layer and cavities in the dielectric layer.

The method forms (at 920) interconnects in and over the dielectric layer. For example, the interconnects 812 may be formed in and over the dielectric layer 820. A plating process may be used to form the interconnects. Forming interconnects may include providing a patterned metal layer over and/or in the dielectric layer. Forming interconnects may also include forming interconnects in cavities of the dielectric layer. Stage 4 of FIG. 8A illustrates and describes an example of forming interconnects in and over a dielectric layer.

The method forms (at 925) a dielectric layer 822 over the dielectric layer 820 and the interconnects 812. A deposition and/or lamination process may be used to form the dielectric layer 822. The dielectric layer 822 may include prepreg and/or polyimide. The dielectric layer 822 may include a photo-imagable dielectric. Forming the dielectric layer 822 may also include forming a plurality of cavities (e.g., 830) in the dielectric layer 822. The plurality of cavities may be formed using an etching process (e.g., photo etching) or laser process. Stages 5-6 of FIGS. 8A-8B illustrate and describe an example of forming a dielectric layer and cavities in the dielectric layer.

The method forms (at 930) interconnects in and over the dielectric layer. For example, the interconnects 814 may be formed in and over the dielectric layer 822. A plating process may be used to form the interconnects. Forming interconnects may include providing a patterned metal layer over and/or in the dielectric layer. Forming interconnects may also include forming interconnects in cavities of the dielectric layer. Stage 8 of FIG. 8B illustrates and describes an example of forming interconnects in and over a dielectric layer.

The method decouples (at 935) the carrier (e.g., 800) from the seed layer (e.g., 801). The carrier 800 may be detached and/or grinded off. The method may also remove (at 935) portions of the seed layer (e.g., 801). An etching process may be used to remove portions of the seed layer 801. Stage 8 of FIG. 8B illustrates and describes an example of decoupling a carrier and seed layer removal.

Different implementations may use different processes for forming the metal layer(s). In some implementations, a chemical vapor deposition (CVD) process, a physical vapor deposition (PVD) process, a sputtering process, a spray coating process, and/or a plating process may be used to form the metal layer(s).

Exemplary Electronic Devices

Figure 10:
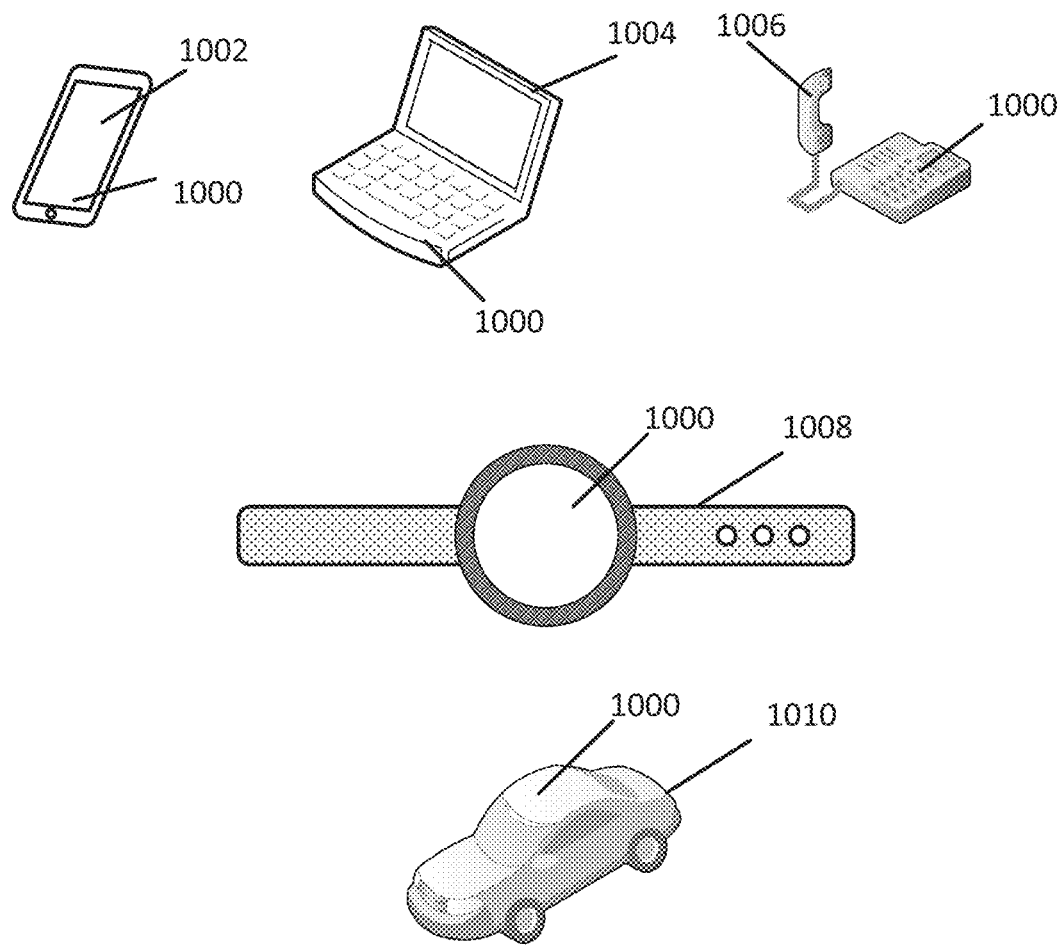
FIG. 10 illustrates various electronic devices that may integrate a die, an electronic circuit, an integrated device, an integrated passive device (IPD), a passive component, a package, and/or a device package described herein.

FIG. 10 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 1002, a laptop computer device 1004, a fixed location terminal device 1006, a wearable device 1008, or automotive vehicle 1010 may include a device 1000 as described herein. The device 1000 may be, for example, any of the devices and/or integrated circuit (IC) packages described herein. The devices 1002, 1004, 1006 and 1008 and the vehicle 1010 illustrated in FIG. 10 are merely exemplary. Other electronic devices may also feature the device 1000 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 1-4, 5A-5E, 6A-6B, 7, 8A-8B, and/or 9-10 may be rearranged and/or combined into a single component, process, feature or function or embodied in several components, processes, or functions. Additional elements, components, processes, and/or functions may also be added without departing from the disclosure. It should also be noted FIGS. 1-4, 5A-5E, 6A-6B, 7, 8A-8B, and/or 9-10 and its corresponding description in the present disclosure is not limited to dies and/or ICs. In some implementations, FIGS. 1-4, 5A-5E, 6A-6B, 7, 8A-8B, and/or 9-10 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another—even if they do not directly physically touch each other. An object A, that is coupled to an object B, may be coupled to at least part of object B. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The terms "encapsulate", "encapsulating" and/or any derivation means that the object may partially encapsulate or completely encapsulate another object. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. A value that is about X-XX, may mean a value that is between X and XX, inclusive of X and XX. The value(s) between X and XX may be discrete or continuous. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace (e.g., trace interconnect), a via (e.g., via interconnect), a pad (e.g., pad interconnect), a pillar, a metallization layer, a redistribution layer, and/or an under bump metallization (UBM) layer/interconnect. In some implementations, an interconnect may include an electrically conductive material that may be configured to provide an electrical path for a signal (e.g., a data signal), ground and/or power. An interconnect may include more than one element or component. An interconnect may be defined by one or more interconnects. An interconnect may include one or more metal layers. An interconnect may be part of a circuit. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

In the following, further examples are described to facilitate the understanding of the invention.

Aspect 1: A device comprising a package and a board coupled to the board. The package includes a substrate comprising a first surface and a second surface; a passive component coupled to the first surface of the substrate; an integrated device coupled to the second surface of the substrate; a back side metal layer coupled to a back side of the integrated device; a first solder interconnect coupled to the back side metal layer; and a plurality of solder interconnects coupled to the second surface of the substrate. The board is coupled to the package through the plurality of solder interconnects, where the first solder interconnect is coupled to the board.

Aspect 2: The device of aspect 1, wherein the package and the board are configured to dissipate heat from the integrated device through the back side metal layer, the first solder interconnect and the board.

Aspect 3: The device of aspects 1 through 2, wherein the board includes a plurality of board interconnects, and wherein the package and the board are configured to dissipate heat from the integrated device through the back side metal layer, the first solder interconnect and at least one board interconnect from the plurality of board interconnects.

Aspect 4: The device of aspects 1 through 3, wherein the back side metal layer and the first solder interconnect are configured to be coupled to ground, and wherein the back side metal layer is configured as an electromagnetic interference (EMI) shield.

Aspect 5: The device of aspects 1 through 4, wherein the back side of the integrated device faces the board.

Aspect 6: The device of aspects 1 through 5, wherein the package further comprises: a first encapsulation layer located over the first surface of the substrate; and a second encapsulation layer located over the second surface of the substrate.

Aspect 7: The device of aspect 6, wherein the package further comprises a metal layer located over a surface of the first encapsulation layer.

Aspect 8: The device of aspect 7, wherein the metal layer is configured to be coupled to ground, and wherein the metal layer is configured as an electromagnetic interference (EMI) shield.

Aspect 9: The device of aspects 1 through 8, wherein the integrated device includes at least one die substrate via that is coupled to the back side metal layer, and wherein the package and the board are configured to dissipate heat from the integrated device through the at least one die substrate via, the back side metal layer, the first solder interconnect and the board.

Aspect 10: The device of aspects 1 through 9, wherein the device includes a particular device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

Aspect 11: A package comprising a substrate comprising a first surface and a second surface; a passive component coupled to the first surface of the substrate; an integrated device coupled to the second surface of the substrate; a back side metal layer coupled to a back side of the integrated device; a first solder interconnect coupled to the back side metal layer; and a plurality of solder interconnects coupled to the second surface of the substrate.

Aspect 12: The package of aspect 11, wherein the package is configured to dissipate heat from the integrated device through the back side metal layer and the first solder interconnect.

Aspect 13: The package of aspects 11 through 12, wherein the back side metal layer and the first solder interconnect are configured to be coupled to ground, and wherein the back side metal layer is configured as an electromagnetic interference (EMI) shield.

Aspect 14: The package of aspects 11 through 13, wherein the back side of the integrated device faces away from the substrate.

Aspect 15: The package of aspects 11 through 14, wherein the package further comprises a first encapsulation layer located over the first surface of the substrate; and a second encapsulation layer located over the second surface of the substrate.

Aspect 16: The package of aspect 15, further comprising a metal layer located over a surface of the first encapsulation layer.

Aspect 17: The package of aspect 16, wherein the metal layer is configured to be coupled to ground, and wherein the metal layer is configured as an electromagnetic interference (EMI) shield.

Aspect 18: The package of aspects 11 through 17, wherein the integrated device includes at least one die substrate via that is coupled to the back side metal layer.

Aspect 19: A method comprising providing a package. The package comprising a substrate comprising a first surface and a second surface; a passive component coupled to the first surface of the substrate; an integrated device coupled to the second surface of the substrate; a back side metal layer coupled to a back side of the integrated device; a first solder interconnect coupled to the back side metal layer; and a plurality of solder interconnects coupled to the second surface of the substrate. The method couples the package to a board coupled through the plurality of solder interconnects, wherein the first solder interconnect is coupled to the board.

Aspect 20: The method of aspect 19, wherein the package and the board are configured to dissipate heat from the integrated device through the back side metal layer, the first solder interconnect and the board.

Aspect 21: The method of aspects 19 through 20, wherein the board includes a plurality of board interconnects, and wherein the package and the board are configured to dissipate heat from the integrated device through the back side metal layer, the first solder interconnect and at least one board interconnect from the plurality of board interconnects.

Aspect 22: The method of aspects 19 through 21, wherein the back side metal layer and the first solder interconnect are configured to be coupled to ground.

Aspect 23: The method of aspects 19 through 22, wherein the back side of the integrated device faces the board.

Aspect 24: The method of aspects 19 through 23, wherein the package further comprises a first encapsulation layer located over the first surface of the substrate; and a second encapsulation layer located over the second surface of the substrate.

Aspect 25: The method of aspect 24, wherein the package further comprises a metal layer located over a surface of the first encapsulation layer.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:
1. A device comprising:
a package comprising:
   a substrate comprising a first surface and a second surface;
   a passive component coupled to the first surface of the substrate;
   an integrated device coupled to the second surface of the substrate;
   a back side metal layer coupled to and touching a back side of the integrated device;
   a first solder interconnect directly coupled to and touching the back side metal layer;
   a plurality of solder interconnects coupled to the second surface of the substrate;
   an encapsulation layer located over the second surface of the substrate,
      wherein a first portion of each one of the plurality of solder interconnects is surrounded by the encapsulation layer and a second portion of each one of the plurality of solder interconnects is free from the encapsulation layer, and
      wherein the encapsulation layer comprises a surface that shares a same horizontal plane as a back side surface of the integrated device and the surface of the encapsulation layer and the same horizontal plane passes to edges of the plurality of solder interconnects through mid-points of the plurality of solder interconnects, the mid-points define the first portion and the second portion of the plurality of solder interconnects; and
a board coupled to the package through the plurality of solder interconnects, wherein the first solder interconnect is coupled to the board.

2. The device of claim 1, wherein the package and the board are configured to dissipate heat from the integrated device through the back side metal layer, the first solder interconnect and the board.

3. The device of claim 1,
wherein the board includes a plurality of board interconnects, and
wherein the package and the board are configured to dissipate heat from the integrated device through the back side metal layer, the first solder interconnect and at least one board interconnect from the plurality of board interconnects.

4. The device of claim 1,
wherein the back side metal layer and the first solder interconnect are configured to be coupled to ground, and
wherein the back side metal layer is configured as an electromagnetic interference (EMI) shield.

5. The device of claim 1, wherein the back side of the integrated device faces the board, the back side of the integrated device is near a transistor layer of the integrated device.

6. The device of claim 1, wherein the package further comprises:
another encapsulation layer located over the first surface of the substrate.

7. The device of claim 6, wherein the package further comprises a metal layer located over a surface of the another encapsulation layer.

8. The device of claim 7,
wherein the metal layer is configured to be coupled to ground, and
wherein the metal layer is configured as an electromagnetic interference (EMI) shield.

9. The device of claim 1,
wherein the integrated device includes at least one die substrate via on the back side of the integrated device, coupled to the back side metal layer, and
wherein the package and the board are configured to dissipate heat from the integrated device through the at least one die substrate via, the back side metal layer, the first solder interconnect and the board.

10. The device of claim 1, wherein the device includes a particular device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

11. The device of claim 1, wherein side surfaces of the back side metal are free of the encapsulation layer.

12. The device of claim 11, wherein side surfaces of the first solder interconnect are free of the encapsulation layer.

13. The device of claim 12, further comprising:
side walls of the integrated device surrounded by the encapsulation layer, wherein a back side of the integrated device is free of the encapsulation layer;
wherein the encapsulation layer extends from the side walls of the integrated device to the first portion of each of the plurality of solder interconnects in the horizontal plane.

14. The device of claim 13, wherein the encapsulation layer extends in a vertical plane from the second surface of the substrate to a bottom of the first portion of each one of the plurality of solder interconnects and from the second surface of the substrate to a bottom of the side walls of the integrated device.

15. The device of claim 1, wherein the first portion of each one of the plurality of solder interconnects includes at least part of a top portion and sides of the part of the top portion of each one of the plurality of solder interconnects and the second portion of each one of the plurality of solder interconnects includes at least part of a bottom portion and sides of the part of the bottom portion of each one of the plurality of solder interconnects.

16. The device of claim 1, wherein the encapsulation layer extends in a vertical plane from the second surface of the substrate to a bottom of the first portion of each one of the plurality of solder interconnects and from the second surface of the substrate to a bottom of side walls of the integrated device.

17. The device of claim 16, wherein a back side of the integrated device is free of the encapsulation layer.

18. The device of claim 1, further comprising:
a plurality of board interconnects, wherein the integrated device is directly coupled to the back side metal, the back side metal is directly coupled to the first solder interconnect, and the first solder interconnect is directly coupled to one of the plurality of board interconnects.

19. A package comprising:
a substrate comprising a first surface and a second surface;
a passive component coupled to the first surface of the substrate;
an integrated device coupled to the second surface of the substrate;
a back side metal layer coupled to and touching a back side of the integrated device;
a first solder interconnect coupled to and touching the back side metal layer;
a plurality of solder interconnects coupled to the second surface of the substrate; and
an encapsulation layer located over the second surface of the substrate,
wherein a first portion of each one of the plurality of solder interconnects is surrounded by the encapsulation layer and a second portion of each one of the plurality of solder interconnects is free from the encapsulation layer, and
wherein the encapsulation layer comprises a surface that shares a same horizontal plane as a back side surface of the integrated device and the surface of the encapsulation layer and the same horizontal plane passes to edges of the plurality of solder interconnects through mid-points of the plurality of solder interconnects, the mid-points define the first portion and the second portion of the plurality of solder interconnects.

20. The package of claim 19, wherein the package is configured to dissipate heat from the integrated device through the back side metal layer and the first solder interconnect.

21. The package of claim 19,
wherein the back side metal layer and the first solder interconnect are configured to be coupled to ground, and
wherein the back side metal layer is configured as an electromagnetic interference (EMI) shield.

22. The package of claim 19, wherein the back side of the integrated device faces away from the substrate, the back side of the integrated device is near a transistor layer of the integrated device.

23. The package of claim 19, wherein the package further comprises:
another encapsulation layer located over the first surface of the substrate.

24. The package of claim 23, further comprising a metal layer located over a surface of the another encapsulation layer.

25. The package of claim 24,
wherein the metal layer is configured to be coupled to ground, and
wherein the metal layer is configured as an electromagnetic interference (EMI) shield.

26. The package of claim 19, wherein the integrated device includes at least one die substrate via on the back side of the integrated device, that is coupled to the back side metal layer.

27. The package of claim 19, further comprising:
side walls of the integrated device surrounded by the encapsulation layer and a back side of the integrated device is free of the encapsulation layer;
wherein the encapsulation layer extends from the side walls of the integrated device to the first portion of each of the plurality of solder interconnects in the horizontal plane.

28. A method comprising:
providing a package comprising:
- a substrate comprising a first surface and a second surface;
- a passive component coupled to the first surface of the substrate;
- an integrated device coupled to the second surface of the substrate;
- a back side metal layer coupled to and touching a back side of the integrated device;
- a first solder interconnect coupled to and touching the back side metal layer;
- a plurality of solder interconnects coupled to the second surface of the substrate;
- an encapsulation layer located over the second surface of the substrate,
  - wherein a first portion of each one of the plurality of solder interconnects is surrounded by the encapsulation layer and a second portion of each one of the plurality of solder interconnects is free from the encapsulation layer, and
  - wherein the encapsulation layer comprises a surface that shares a same horizontal plane as a back side surface of the integrated device and the surface of the encapsulation layer and the same horizontal plane passes to edges of the plurality of solder interconnects through mid-points of the plurality of solder interconnects, the mid-points define the first portion and the second portion of the plurality of solder interconnects; and
- coupling the package to a board coupled through the plurality of solder interconnects, wherein the first solder interconnect is coupled to the board.

29. The method of claim 28, wherein the package and the board are configured to dissipate heat from the integrated device through the back side metal layer, the first solder interconnect and the board.

30. The method of claim 29,
wherein the board includes a plurality of board interconnects, and
wherein the package and the board are configured to dissipate heat from the integrated device through the back side metal layer, the first solder interconnect and at least one board interconnect from the plurality of board interconnects.

31. The method of claim 28, wherein the back side metal layer and the first solder interconnect are configured to be coupled to ground.

32. The method of claim 28, wherein the back side of the integrated device faces the board.

33. The method of claim 28, wherein the package further comprises:
another encapsulation layer located over the first surface of the substrate.

34. The method of claim 33, wherein the package further comprises a metal layer located over a surface of the another encapsulation layer.

* * * * *